(12) United States Patent
Agrawal et al.

(10) Patent No.: US 6,590,415 B2
(45) Date of Patent: Jul. 8, 2003

(54) METHODS FOR CONFIGURING FPGA'S HAVING VARIABLE GRAIN COMPONENTS FOR PROVIDING TIME-SHARED ACCESS TO INTERCONNECT RESOURCES

(75) Inventors: Om P. Agrawal, Los Altos, CA (US); Bradley A. Sharpe-Geisler, San Jose, CA (US); Herman M. Chang, Cupertino, CA (US); Bai Nguyen, San Jose, CA (US); Giap H. Tran, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 233 days.

(21) Appl. No.: 09/841,209

(22) Filed: Apr. 23, 2001

(65) Prior Publication Data

US 2002/0196809 A1 Dec. 26, 2002

Related U.S. Application Data

(63) Continuation-in-part of application No. 09/626,094, filed on Jul. 26, 2000, now Pat. No. 6,380,759, which is a continuation of application No. 09/472,645, filed on Dec. 27, 1999, now Pat. No. 6,150,842, which is a continuation of application No. 08/948,306, filed on Oct. 9, 1997, now Pat. No. 6,097,212, application No. 09/841,209, which is a continuation of application No. 09/669,186, filed on Sep. 25, 2000, now Pat. No. 6,249,144, which is a continuation of application No. 09/212,022, filed on Dec. 15, 1998, now Pat. No. 6,124,730.

(51) Int. Cl.[7] .................. G06F 7/38; H03K 19/173
(52) U.S. Cl. ......................... 326/38; 326/41
(58) Field of Search ..................... 326/40, 38, 39, 326/41, 46, 47

(56) References Cited

U.S. PATENT DOCUMENTS

| | | | |
|---|---|---|---|
| 5,258,668 A | 11/1993 | Cliff et al. | 326/41 |
| 5,455,525 A | 10/1995 | Ho et al. | 326/41 |
| 5,537,057 A | 7/1996 | Leong et al. | 326/41 |
| 5,598,109 A | 1/1997 | Leong et al. | 326/41 |
| 5,682,107 A | 10/1997 | Tavana et al. | 326/41 |
| 5,815,003 A | 9/1998 | Pedersen | 326/39 |

*Primary Examiner*—Daniel Chang
(74) *Attorney, Agent, or Firm*—MacPherson Kwok Chen & Heid LLP; Gideon Gimlan

(57) ABSTRACT

A Variable Grain Architecture (VGA) is used for synthesizing from primitive building elements (CBE's) an appropriate amount of dynamic multiplexing capability for each given task. Unused ones of such Configurable Building Elements (CBE's) are reconfigured to carry out further logic functions in place of the dynamic multiplexing functions.

Each CBE may be programmably configured to provide no more than a 2-to-1 dynamic multiplexer (2:1 DyMUX). The dynamically-selectable output of such a synthesized 2:1 DyMUX may then be output onto a shared interconnect line. Pairs of CBE's may be synthetically combined to efficiently define 4:1 DyMUX's with each such 4:1 multiplexer occupying a Configurable Building Block (CBB) structure. Pairs of CBB's may be synthetically combined to efficiently define 8:1 DyMUX's with each such synthesized 8:1 multiplexer occupying a vertically or horizontally-extending leg portion of an L-shaped, VGB structure (Variable Grain Block). The so-configured leg portion of the VGB may then output the signal selected by its 8:1 DyMUX onto a shared interconnect line that is drivable by the VGB leg. Pairs or quartets of VGB's may be synthetically combined to efficiently define higher order, N:1 DyMUX's.

13 Claims, 15 Drawing Sheets

| LLDi | DyOE_J | SupOE_J' | J_Kz0 (IN0) | J_Kz1 (IN1) | J'_Kz2 (IN2) | J'_Kz3 (IN3) | FTK_J0 (IN4) | FTK_J1 (IN5) | FTK_J2 (IN6) | FTK_J'3 (IN7) |
|---|---|---|---|---|---|---|---|---|---|---|
| N1 | DyOE_A | DyOE_B | B_Yz | B_Xz | A_Yz | A_Xz | FTX1_B | FTX2_B | FTX1_A | FTX2_A |
| N2 | DyOE_A | DyOE_B | B_Wz | B_Zz | A_Wz | A_Zz | FTX1_B | FTX2_B | FTX1_A | FTX2_A |
| N3 | DyOE_A | DyOE_B | B_Yz | B_Zz | A_Yz | A_Zz | FTX1_B | FTX2_B | FTX1_A | FTX2_A |
| N4 | DyOE_A | DyOE_B | B_Wz | B_Xz | A_Wz | A_Xz | FTX1_B | FTX2_B | FTX1_A | FTX2_A |
| E1 | DyOE_B | DyOE_D | D_Xz | D_Yz | B_Xz | B_Yz | FTY1_D | FTY2_D | FTY1_B | FTY2_B |
| E2 | DyOE_B | DyOE_D | D_Zz | D_Wz | B_Zz | B_Wz | FTY1_D | FTY2_D | FTY1_B | FTY2_B |
| E3 | DyOE_B | DyOE_D | D_Xz | D_Wz | B_Xz | B_Wz | FTY1_D | FTY2_D | FTY1_B | FTY2_B |
| E4 | DyOE_B | DyOE_D | D_Zz | D_Yz | B_Zz | B_Yz | FTY1_D | FTY2_D | FTY1_B | FTY2_B |
| S1 | DyOE_D | DyOE_C | C_Yz | C_Xz | D_Yz | D_Xz | FTX1_C | FTX2_C | FTX1_D | FTX2_D |
| S2 | DyOE_D | DyOE_C | C_Wz | C_Zz | D_Wz | D_Zz | FTX1_C | FTX2_C | FTX1_D | FTX2_D |
| S3 | DyOE_D | DyOE_C | C_Yz | C_Zz | D_Yz | D_Zz | FTX1_C | FTX2_C | FTX1_D | FTX2_D |
| S4 | DyOE_D | DyOE_C | C_Wz | C_Xz | D_Wz | D_Xz | FTX1_C | FTX2_C | FTX1_D | FTX2_D |
| W1 | DyOE_C | DyOE_A | A_Xz | A_Yz | C_Xz | C_Yz | FTY1_A | FTY2_A | FTY1_C | FTY2_C |
| W2 | DyOE_C | DyOE_A | A_Zz | A_Wz | C_Zz | C_Wz | FTY1_A | FTY2_A | FTY1_C | FTY2_C |
| W3 | DyOE_C | DyOE_A | A_Xz | A_Wz | C_Xz | C_Wz | FTY1_A | FTY2_A | FTY1_C | FTY2_C |
| W4 | DyOE_C | DyOE_A | A_Zz | A_Yz | C_Zz | C_Yz | FTY1_A | FTY2_A | FTY1_C | FTY2_C |
| | FROM COMMON CONTROL 358's | | FROM CSE 348's | | | | FEEDTHROUGHS | | | |

FIG. 9B

METHODS FOR CONFIGURING FPGA'S HAVING VARIABLE GRAIN COMPONENTS FOR PROVIDING TIME-SHARED ACCESS TO INTERCONNECT RESOURCES

This application continues-in-part from U.S. Ser. No. 09/626,094, filed Jul. 26, 2000, now U.S. Pat. No. 6,380,759, where the latter continued from Ser. No. 09/472,645, filed Dec. 27, 1999, now U.S. Pat. No. 6,150,842, which continued from Ser. No. 08/948,306, filed Oct. 9, 1997, now U.S. Pat. No. 6,097,212. This application additionally continues from Ser. No. 09/669,186, filed Sep. 25, 2000, now U.S. Pat. No. 6,249,144, which continued from Ser. No. 09/212,022, filed Dec. 15, 1998, now U.S. Pat. No. 6,124,730. The disclosures of said applications are incorporated herein by reference.

BACKGROUND

1. Field of the Invention

The invention relates generally to integrated circuits having repeated logic and interconnect structures provided therein. The invention relates more specifically to providing time-shared access to limited interconnect resources within field programmable gate arrays (FPGA's).

2a. Cross Reference to Related Applications

The following co-pending U.S. patent applications(s) are owned by the owner of the present application and their disclosures are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,612 filed Dec. 22, 1997, by Om Agrawal et al. and originally entitled, "FLEXIBLE DIRECT CONNECTIONS BETWEEN INPUT/OUTPUT BLOCKS (IOBs) AND VARIABLE GRAIN BLOCKs (VGBs) IN FPGA INTEGRATED CIRCUITS";

(F) Ser. No. 08/997,221 filed Dec. 22, 1997, by Om Agrawal et al. and originally entitled, "PROGRAMMBLE CONTROL MULTIPLEXING FOR INPUT/OUTPUT BLOCKS (IOBs) IN FPGA INTEGRATED CIRCUITS";

(G) Ser. No. 09/008,762 filed Jan. 19, 1998 by Om Agrawal et al. and originally entitled, "SYNTHESIS-FRIENDLY FPGA ARCHITECTURE WITH VARIABLE LENGTH AND VARIABLE TIMING INTERCONNECT"; and (H) Ser. No. 08/996,049 filed Dec. 22, 1997 by Om Agrawal et al. and originally entitled "DUEL PORT SRAM MEMORY FOR RUN-TIME USE IN FPGA INTEGRATED CIRCUITS".

2b. Cross Reference to Related Patents

The following U.S. patent(s) are related to the present application and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

3. Description of the Related Art

As density within integrated circuits (IC's) of digital logic circuitry increases, and as signal processing speed of such logic also increases, the ability to couple respective signals to an appropriate kinds of interconnect resource becomes more difficult.

Artisans have begun to recognize that conductors of different lengths and orientations should be provided for servicing different kinds of signals in programmable logic arrays. By way of example, a first class of relatively long and relatively low-resistance conductors are included for broadcasting common control signals (e.g., clock, clock enable, etc.) over relatively large distances of the IC device with minimal skew. Such special conductors are sometimes referred to as low-skew longlines.

As a further example, some wire segments are dedicated for transmitting logic input and logic output signals between immediately adjacent logic sections without routing through general switch matrices. These dedicated conductors are sometimes referred to as direct-connect lines.

At the same time that specialized conductors are provided, artisans strive to continue to provide field programmable logic arrays with general-purpose conductors and general-purpose routing switches for carrying out general-purpose, programmable routing of signals.

With all different kinds of conductors competing for space within the interconnect layers of an IC, the numbers of conductors for each kind of specialized interconnect resource (e.g., longlines) at each location becomes a relatively limited resource. Every signal within a complex design cannot be allowed to have its own dedicated interconnect line. If it were otherwise, the limited interconnect resources of the field-programmable array device would soon be exhausted. Fortunately, many designs allow for the transmission of plural signals at different times over a shared interconnect line. Such sharing may come in the form of time-domain multiplexing or burst-mode operations.

A number of different circuit techniques have been developed for allowing multiple signals to share a same interconnect line. Multiple tristate drivers may be used for example, with each tristate driver becoming a line master at a different time while the other tristate drivers of the same line go into a high-impedance output mode. The line-driving signal of that moment then passes without contention onto the shared line through its line-mastering, tristate (three state) driver.

In an alternative approach, a shared wire is urged towards a predefined logic state by means of a pull-up or pull-down resistor. An open-drain technology is then used to implement a wired-OR circuit on the urged line. Sharing signals OR into the shared line at different times. If desired, a logical ORring of simultaneous signals may be carried out on the so-driven line.

A third approach provides a dedicated multiplexer for driving the shared line. At each given time, an appropriately desired signal is selected by the dedicated multiplexer for output onto the shared line.

Each of these approaches has drawbacks. Tristate drivers tend to consume more circuit area than two-state drivers. They also generally need specialized control circuits for controlling their output-enable (OE) terminals so that contention and crowbar currents will be avoided. Wired-OR circuits tend to consume more power than purely CMOS circuits. Dedicated multiplexers are wasteful if it happens that their full selection capabilities are not utilized in a given design implementation.

SUMMARY OF THE INVENTION

An improved multiplexing scheme in accordance with the invention uses a Variable Grain Architecture (VGA) for synthesizing from primitive building elements (CBE's) an appropriate amount of dynamic multiplexing capability for each given task. Unused ones of such Configurable Building Elements (CBE's) may be reconfigured to carry out logic functions in place of dynamic multiplexing functions.

In one embodiment, each CBE may be programmably configured to provide no more than a 2-to-1 dynamic multiplexer (2:1 DyMUX). The dynamically-selectable output of such a synthesized 2:1 DyMUX may then be output onto a shared interconnect line. In the same embodiment, pairs of CBE's may be folded-together or synthetically combined to efficiently define 4-to-1 dynamic multiplexers (4:1 DyMUX's) with each such 4:1 multiplexer occupying a Configurable Building Block (CBB) structure. The dynamically-selectable output of each 4:1 DyMUX may then be output onto a shared interconnect line that is drivable by the CBB. Pairs of CBB's may be folded-together or synthetically combined in the same embodiment to efficiently define 8-to-1 dynamic multiplexers (8:1 DyMUX's) with each such synthesized 8:1 multiplexer occupying a vertically or horizontally-extending leg portion of an L-shaped, VGB structure (Variable Grain Block). The so-configured leg portion of the VGB may then output the signal selected by its 8:1 DyMUX onto a shared interconnect line that is drivable by the VGB leg.

If desired, intraconnect lines within each VGB (feedback lines) may be used in the same embodiment to efficiently define 13-to-1 dynamic multiplexers (13:1 DyMUX's) with each such synthesized 13:1 multiplexer occupying its respective VGB. The so-configured VGB may then output the signal selected by its 13:1 DyMUX onto a shared interconnect line that is drivable by the VGB.

At each progressive step of synthesizing larger and larger dynamic multiplexers, remaining portions of the configurable logic may be used for synthesizing other logic functions. Thus the dynamic multiplexers can be variably tailored to consume only as much of the logic resources with the FPGA as are needed for such multiplexing.

The 4:1 dynamic multiplexers, 8:1 DyMUX's and 13:1 DyMUX's described here may be synthesized without unnecessarily using interconnect resources outside the VGB (other than the feedback lines for the 13:1 DyMUX's). Thus interconnect resources are preserved and amplified by allowing for time multiplexing of signals onto shared conductors.

Other aspects of the invention will become apparent from the below detailed description.

BRIEF DESCRIPTION OF THE DRAWINGS

The below detailed description makes reference to the accompanying drawings, in which:

FIG. 9B is a matrix showing input and control connections for one plurality of circuits such as shown in FIG. 9A;

DETAILED DESCRIPTION

Figure 1A:
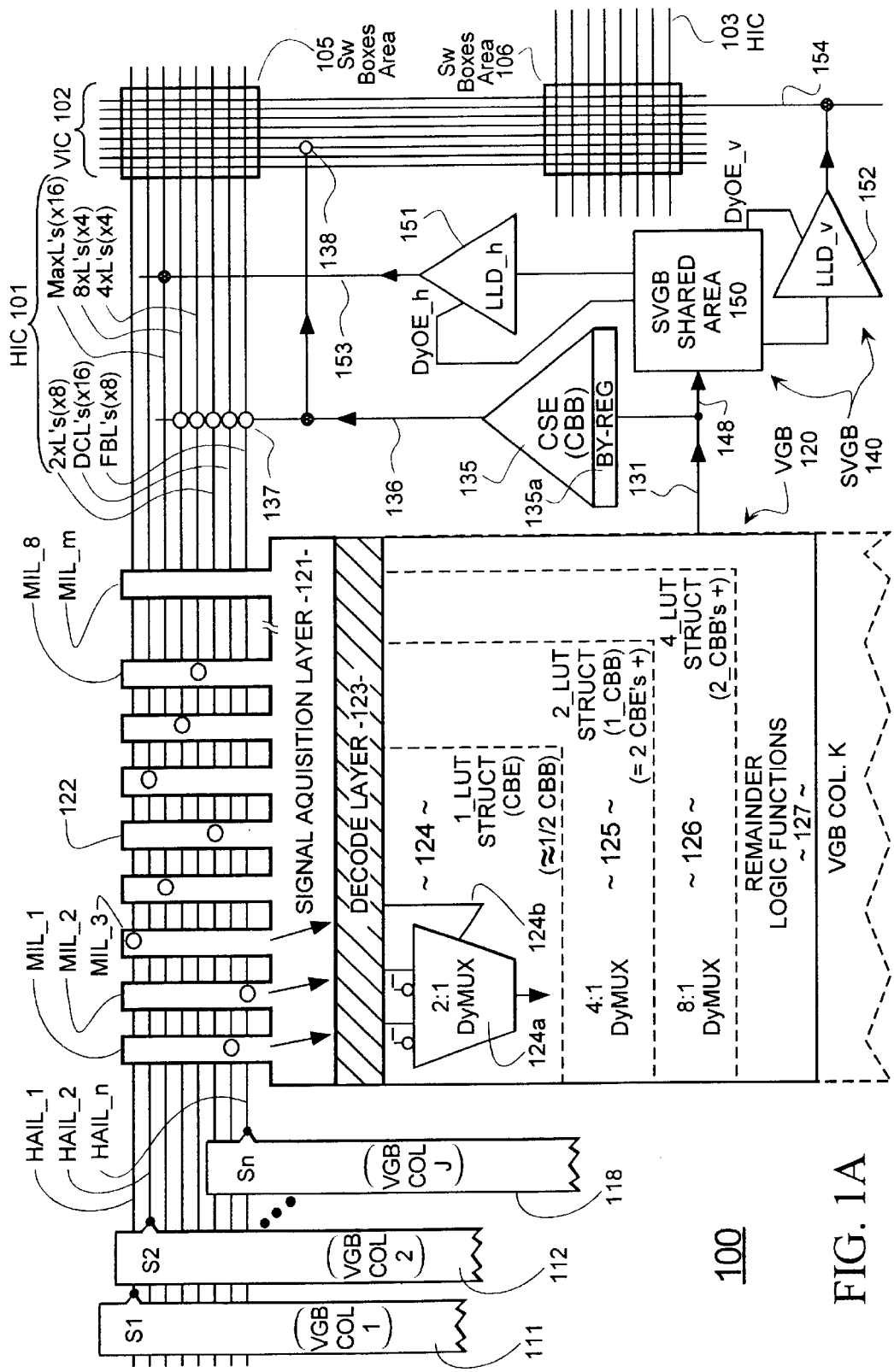
FIG. 1A provides a schematic diagram for explaining how the variably-granulatable multiplexing scheme of the present invention can be tailored to match the multiplexing needs of different designs.

FIG. 1A provides a schematic diagram of a portion 100 of an integrated circuit (IC) device in accordance with the invention. IC portion 100 includes a horizontally-extending interconnect channel (HIC) 101 and a vertically-extending interconnect channel (VIC) 102. A first switchboxes area 105 is provided at the intersection of HIC 101 and VIC 102. The switchboxes area 105 includes a plurality of programmably-configurable switchboxes for selectively routing signals through the switchboxes area. Signals may continue along the same linear direction in which they enter the switchboxes area 105. Signals may also be routed so as to continue in an orthogonal direction along a conductor within a correspondingly orthogonal interconnect channel. A second switchboxes area 106 is shown provided at the intersection of VIC 102 and yet another HIC, 103. The second switchboxes area 106 is mirror-symmetrical with the first area 105.

Each of HIC 101 and VIC 102 includes a same set of diversified interconnect conductors. In one embodiment these diversified conductors include eight, VGB intra-connecting feedback lines (FBL's), 16 direct connect lines (DCL's), eight double-length conductors (2×L's), four quad-length conductors (4×L's), four octal-length conductors (8×L's) and 16 maximum-length conductors (MaxL's). Although not shown, each of HIC 101 and VIC 102 further includes two dedicated clock lines of maximum length. See FIG. 3.

Full explanations of uses for each of the diversified interconnect conductors mentioned here (FBL's through MaxL's) may be found in at least one of the above-cited patent applications. In brief, 2×L conductors each extend continuously and linearly for a distance of two variable grain structures known as VGB's. Similarly, each 4×L conductor extends continuously and linearly alongside four VGB's. Most 8×L conductors each extend continuously and linearly along eight VGB's. Each MaxL line extends linearly for a maximum distance within the array. Such MaxL lines are also referred to as longlines. Each DCL is a nonlinear continuum of conductor that is dedicated for broadcasting a signal from a correspondingly dedicated, source VGB to a small cluster of neighboring VGB's. Each FBL is a non-linear conductor continuum that extends about a respective VGB for providing high-speed intra-connections within the VGB proper.

Each VGB (variable grain block) is provided adjacent to at least one HIC or VIC. In one embodiment, four VGB's are wedged together to define respective and mirror-symmetrical four corners of a super-VBG structure (SVGB). See FIG. 2. Each VGB in this SVGB structure is disposed adjacent to one HIC and one VIC of four interconnect channels that surround the SVGB structure in mirror-symmetrical fashion. The SVGB's are arranged as columns and rows. The HIC's and VIC's are also arranged as parallel columns and rows running along the columns and rows of SVGB's.

Figure 2A:
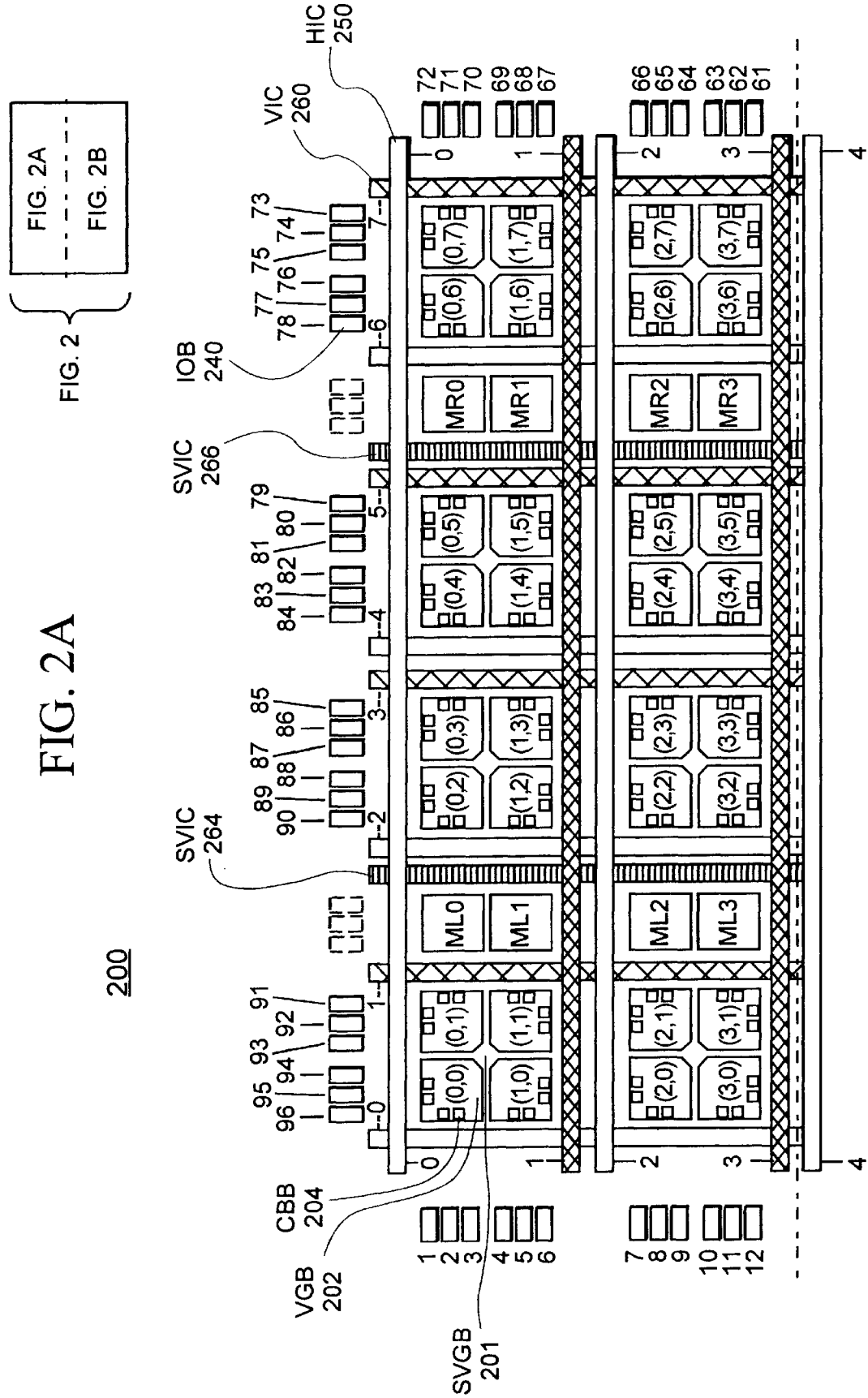
FIG. 2 illustrates an IC device in accordance with the invention having a matrix of SVGB structures, surrounding interconnect channels, and also embedded memory columns.
Figure 2B:
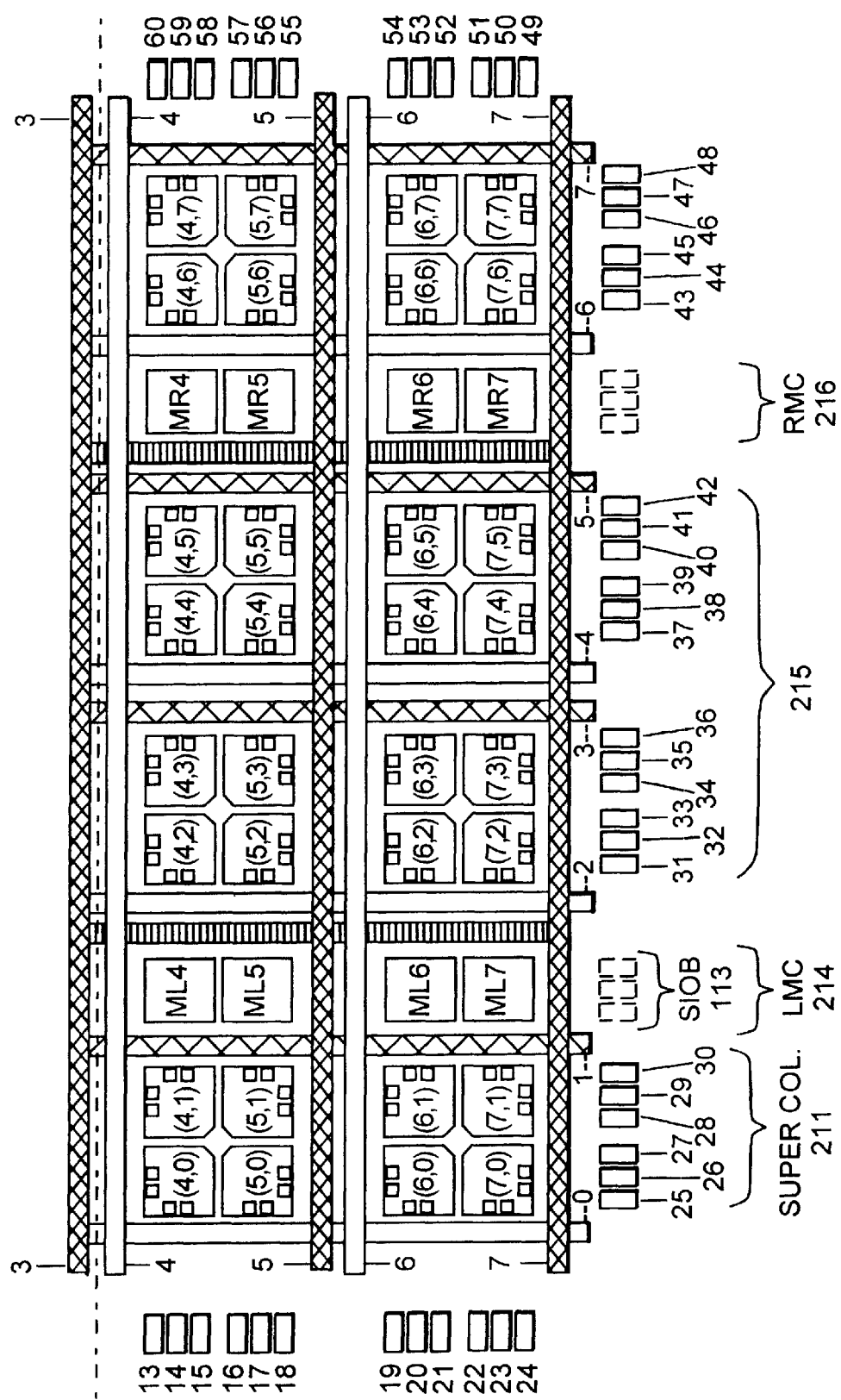

FIG. 1A shows a sample VGB 120 disposed within a given VGB column K (VGB COL K). There are two VGB columns within each SVGB column. Two mirror-symmetrical VIC's brace each SVGB column. FIG. 2 shows a layout at a macroscopic level wherein 211 defines a SVGB column braced by VIC's 0 and 1. More will be said about FIG. 2 below.

Referring still to the more microscopic view of FIG. 1A, a signal acquisition layer 121 of VGB 120 has finger structures such as 122 extending orthogonally over HIC 101 for acquiring signals from a statically-selected subset of the wires in neighboring HIC 101.

The term 'static selection' as used herein refers to selection processes that occurs during a configuring phase of usage of the FPGA device. In the configuring phase, configuration memory is programmed to define interconnect routings and logic functions in LUT's (look up tables). When the FPGA device is later used during run-time, statically-made selections such as signal routings cannot be quickly altered. In contrast, 'dynamic selections' can be freely and quickly altered during run-time.

From the view point of VGB 120, each of the individual conductors of the adjacent HIC 101 may be referred to as a Horizontal Adjacent Interconnect Line or 'HAIL'. Some of these HAIL's may extend continuously to other VGB's (not shown) while others may terminate in the nearby switchboxes area 105.

The acquisition layer 121 of VGB 120 provides input interfacing with its HAIL's. Fingers such as 122 of this acquisition layer 121 each represent one of a limited plurality of static multiplexers that may be configured during configuration-time. The static multiplexers may be used to select from the many diversified HAIL's (56 lines in the illustrated example), a subset of such conductors from which signals will be supplied to VGB 120. Each such static multiplexer of FIG. 1A is also referred to by a MIL number, where the MIL is a multiplexer input line on which the statically selected signal appears as it is input into the VGB.

For purposes of example, open circles are used in FIG. 1A to provide an indication of which HAIL is statically-selected by each of the MIL_1 through MIL_8 fingers. Each such MIL finger is shown having a corresponding and overlapping open circle within it at the position of its selected HAIL. Such internally-hollow circles are also used to represent programmable interconnect points (PIP's). The illustrated open circles within the MIL fingers of region 121 may be thought of as the specific PIP's that have been activated for connecting to a specific HAIL. More specifically in the illustrated example, MIL_3 is illustrated as connecting to an adjacent horizontal line identified as HAIL_1 while MIL_2 is illustrated as connecting to another line identified as HAIL_n. The identifiacations of HAIL_1 through HAIL_n at the left side of FIG. 1A do not correspond with the identification of some lines at the right side of FIG. 1A as being of different types (2×L, 4×L, etc.). Illustrative liberty was taken to specify two different concepts with the same schematic symbols.

There are a limited number, m, of MIL fingers (122) of each VGB that cross with a given interconnect channel. In one embodiment, the integer m is at least six but substantially less than the number of HAIL's in the adjacent horizontal interconnect channel 101. In an embodiment (FIG. 3) that has 56 AIL's in each adjacent interconnect channel, each VGB has sixteen MIL fingers crossing with each of its adjacent interconnect channels (8 fingers per CBB). Thus the limited number of m MIL fingers operate to statically bring into the VGB proper (120) a subset of m signals from the greater than m number of adjacent signals in the adjacent channel so that the acquired m signals may be further processed within the VGB 120.

Each VGB contains a set of primitive building blocks known as Configurable Building Elements (CBE's). Each CBE has at least one, statically-configurable lookup table (LUT) with at least 3 address-input terminals. Pairs of CBE's may be synthetically-combined or folded-together to define a higher level building block known as a CBB (Configurable Building Block). See element 204 of FIG. 2. Details concerning such folding-together operations and concerning the structures of CBB's may be found in at least one of the above-cited patent applications.

Pairs of CBB's may be further combined or folded together to define a yet-higher level building block known as a CBB-duet. In one embodiment, the largest building structure allowed within each VBG is a combination of two CBB-duets-to form a CBB-quartet. It is, of course, within the contemplation of the present invention to allow for yet larger combinations of foldings within each VGB.

Each CBE has a certain subset of fingers within MIL_1 through MIL_m assigned to it for acquiring signals in a transparent decode mode. Each CBE includes a primitive lookup table (LUT) having a same number of address input terminals. For example, in one embodiment the primitive LUT has only three input terminals. In such an embodiment MIL_1, MIL_2 and MIL_3 may be assigned for acquiring the respective three address input signals of the CBE.

In FIG. 1A, the one-LUT structure or CBE is shown as a dashed first box 124. The three address input terminals of the LUT provide input signals to a LUT-implemented, 2:1 dynamic multiplexer (DyMUX) 124a. A programmably-configurable decode layer 123 is provided between acquisition layer 121 and the one-LUT CBE's such as 124. When the intervening decode layer 123 is in a 'transparent' or pass-through mode, the three acquired signals of MIL fingers MIL_1-MIL_3 pass correspondingly to the three address input terminals of the primitive LUT. Decode layer 123 is configurable to have other modes, as will be discussed later.

As mentioned, FIG. 1A illustrates the 3-input LUT of CBE 124 to have been configured to emulate a two-to-one (2:1) dynamic multiplexer 124a. Each of the two selectable inputs of the 2:1 DyMUX 124a can be statically configured to be inverting or non-inverting. The select terminal 124b (defined by the third LUT address-inputting terminal) can receive signals which dynamically change during FPGA run-time. Thus, the emulated 2:1 multiplexer is a dynamic multiplexer (DyMUX).

VGB 120 may be configured such that it contains only one 2:1 DyMUX 124a while the remainder of the variable grain resources within VBG 120 are used for providing other logic functions 127. The other logic functions 127 may include other, independent 2:1 DyMUX's. The choice to do so may be made based on the needs of the overall design that is to be implemented in the FPGA.

Alternatively, a larger 4:1 DyMUX 125 may be formed within VGB 120 by folding together two CBE's while the remainder of the granulatable logic resources within VGB 120 are used for providing other logic functions 127. The other logic functions 127 may include other, independent 4:1 DyMUX's or 2:1 DyMUX's. Again, the choice to do so may be made based on the needs of the overall design that is to be implemented in the FPGA.

As yet another alternative, two CBB's may be folded together within VGB 120 to define an 8:1 DyMUX 126 while a remainder of the granulatable logic resources within VGB 120 provide other logic functions. The other logic functions 127 may include other, independent 8:1 DyMUX's, 4:1 DyMUX's, or 2:1 DyMUX's.

Implementation of any one or more of the 2:1 DyMUX (124), 4:1 DyMUX (125) and 8:1 DyMUX (126) may be carried out without unnecessarily consuming a substantial number of conductors in the adjacent interconnect. Thus the implemented DyMUX's may be used to efficiently select and dynamically multiplex plural signals onto a shared interconnect conductor.

Each so-implemented, 2:1 DyMUX (124), 4:1 DyMUX (125) and 8:1 DyMUX (126) may be seen as a synthsized, N:1 DyMUX whose selection range, N, has been tailored to match the needs of the overall design that is to be implemented in the FPGA.

The output of each synthesized N:1 DyMUX may be passed along coupling 131 to a Configurable Sequential Element (CSE) 135 that belongs to one of the utilized CBB's. The CSE 135 includes a programmably-by-passable register 135a in which the output of the N:1 DyMUX may be stored.

Output signals 136 of the CSE 135 may be routed through a set of PIP's 137 for application to different kinds of HAIL'S, including a 2×L line, a 4×L line, a 8×L line, a direct connect line (DCL), and a feedback line (FBL). Output signals 136 of the CSE 135 may be further routed through a another PIP 138 for application to an orthogonally-running 2×L line of VIC 102.

Any one or more of the lines driven by CSE 135 may become the shared interconnect line to which different signals are selectively applied by way of the N:1 DyMUX (124 or 125 or 126) that has been synthesized in the encompassing VGB structure 120. (CSE 135 is part of VGB 120. It is shown as being outside so that the concept of granularly-variable implementation of the N:1 DyMUX can be better illustrated by rectangle 120 and the dashed internal rectangles, 124, 125 and 126.)

The output of the implemented N:1 DyMUX may also be passed along coupling 148 to a SVGB shared area 150. Area 150 is centrally shared within a SVGB 140 by the encompased VGB's (variable grain blocks) of that super-VGB structure 140. From shared area 150, the coupled signal 148 may be output through either of longline drivers (tristate drivers) 151 and 152 to a corresponding MaxL line in the respective HIC 101 or VIC 102. One such MaxL line of VIC 102 is explicitly shown at 154. Line 153 is understood to similarly connect to a MaxL line in HIC 101.

Longline drivers (tristate drivers) 151 and 152 are respectively controlled at their OE terminals by dynamic output-enabling signals, DyOE_h and DyOE_v. These dynamic output-enabling signals, DyOE_h and DyOE_v, are provided from shared area 150 for defining when respective tristate drivers 151 and 152 will be line masters of their respective longlines. It is understood that other SVGB's have similar tristate drivers capble of driving the same longlines.

The plural signals that are statically-acquired by fingers 122 and then multiplexed by the synthesized N:1 DyMUX, 124 or 125 or 126, originate from respective signal sources, S1, S2, . . . , Sn. These signal sources, S1, S2, . . . , Sn (also identified as 111, 112, . . . , 118) can be any circuits that connect to the respective, horizontal adjacent interconnect lines, HAIL_1, HAIL_2, . . . , HAIL_n. Examples of these signal sources, S1, S2, . . . , Sn may include VGB s in the same row as VGB 120 but in different columns (e.g., VGB columns 1, 2, J). Thus the same-row VGB's will have counteparts to CSE 135 and LLD (longline driver) 151. These counterparts can source the original signals onto one kind of interconnect resource, say direct connect lines (DCL's). The synthesized N:1 DyMUX (124,125, 126) can dynamically select one of these sourced signals and direct it to another kind of interconnect resource, say a MaxL line. Examples of these signal sources, S1, S2, . . . , Sn may alternatively or additionally include switchboxes such as in area 105 that are provided in the same row as switchboxes area 105. Further examples of these signal sources, S1, S2, . . . , Sn may alternatively or additionally include IOB's and/or embedded SRAM modules (e.g., ML0–MR7 in FIG. 2).

The dynamically multiplexed output does not have to be returned to the same channel from which the source signals S1, S2, . . . , Sn came. Instead it could be directed to an orthogonal channel such as would be the case if the dynamically multiplexed output takes path 148 through area 150, through LLD 152 to MaxL line 154. Alternatively, the dynamically multiplexed output could be directed to a spaced-apart, parallel channel such as would be the case if the dynamically multiplexed output traveled through PIP 138 and down the corresponding 2×L line to switchboxes area 106, and from there onto HIC 103 (e.g., onto an 8×L line in HIC 103).

Figure 1B:
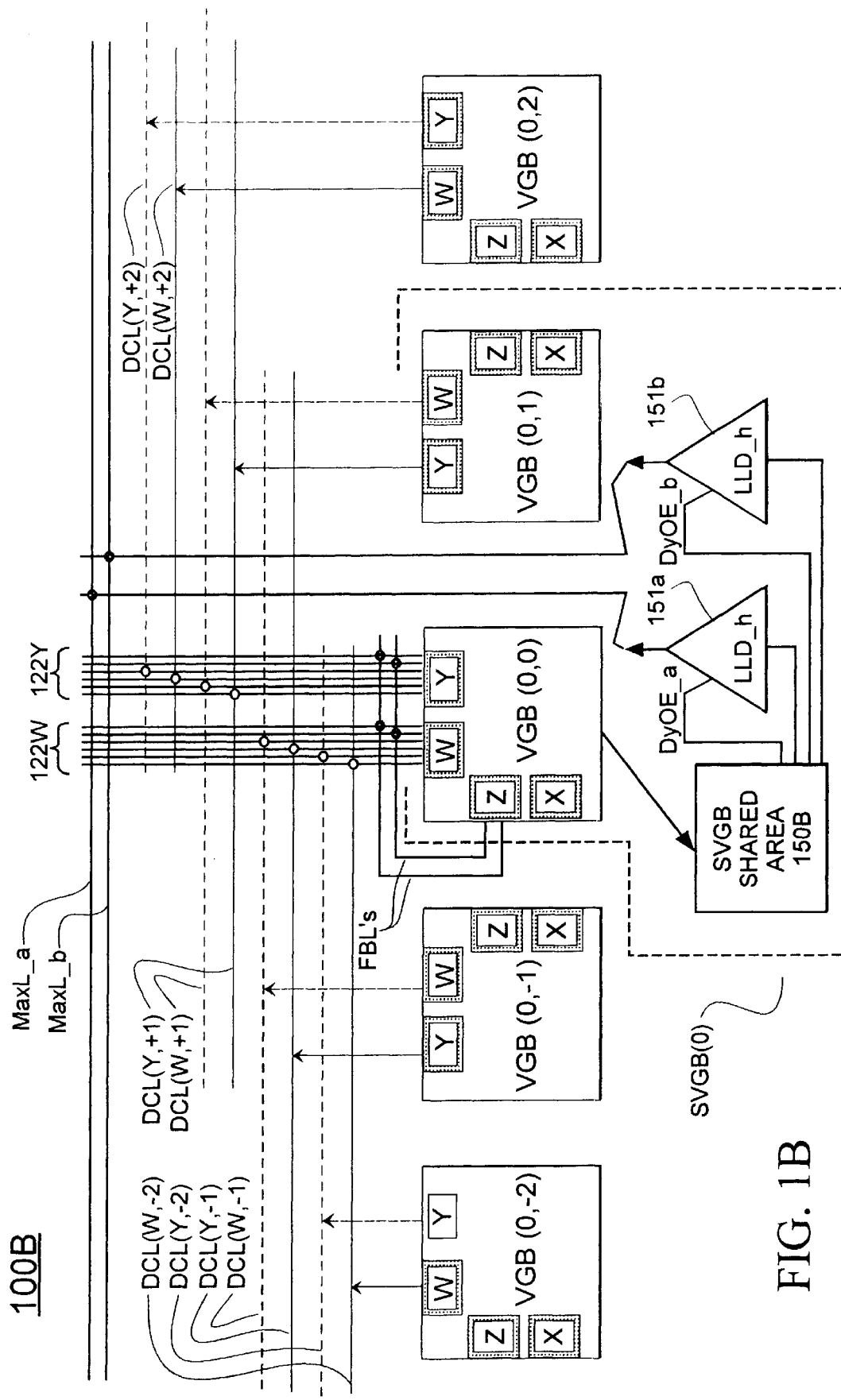
FIG. 1B provides an example showing variably-granulatable multiplexing for signals sourced on direct connect lines.

FIG. 1B provides a more concrete example of how the dynamic multiplexing scheme of FIG. 1A may be carried out. Five VGB's are shown in the embodiment 100B of FIG. 1B and respectively labeled according to the row and columns they occupy as: VGB(0,−2), VGB(0,−1), VGB(0, 0), VGB(0,1) and VGB(0,2). Each illustrated VGB has four Configurable Building Blocks respectively labled as X, Z, W, and Y. VGB(0,0) and VGB(0,1) are in a first SVGB(0) (not fully shown).

Each CBB (X, Z, W, and Y) drives a CBB-dedicated direct connect line (DCL). These DCL's are labeled in FIG. 1B according to their source CBB. Alternating solid and dashed lines are used for alternating ones of the DCL's. Each DCL extends a distance of two VGB's to the left and two VGB's to the right of its driving VGB. DCL(W,−1) therefore extends past VGB(0,0). DCL(Y,+2) also extends past VGB(0,0).

The MIL fingers of the W and Y CBB's in VGB(0,0) are respectively denoted as 122W and 122Y. These fingers 122W and 122Y cross with the eight illustrated DCL's. The activated PIP's on each finger are shown as open circles. A first 4:1 DyMUX may be synthesized in CBB W(0,0). A second 4:1 DyMUX may be synthesized in Y(0,0). Alternatively, these W and Y Configurable Building Blocks of VGB(0,0) may be folded-together to synthesize a 8:1 DyMUX. FBL's are shown providing dynamic multiplexer control signals sourced from Z(0,0) to the 4 remaining fingers of groups 122W and 122Y. If the 8:1 DyMUX is implemented, then 3 of the 4 remaining fingers define the select control terminals of the 8:1 multiplexer.

The dynamically multiplexed output or outputs of VGB (0,0) are fed to shared area 150B for coupling to one or both of tristate drivers 151a and 151b. The outputs of tristate drivers 151a and 151b are respectively coupled to MaxL lines MaxL_a and MAxL_b of the same horizontal interconnect channel (HIC). In an alternative routing scheme, longlines MaxL_a and MAxL_b may be disposed in a vertical interconnect channel (VIC) that extends by SVGB (0).

FIG. 2 shows a macroscopic view of an FPGA device 200 in accordance with the invention. The illustrated structure is preferably formed as a monolithic integrated circuit.

The macroscopic view of FIG. 2 is to be understood as being taken at a magnification level that is lower than otherwise-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity.

FPGA device 200 includes a regular matrix of super structures defined herein as super-VGB's (SVGB's). In the illustrated embodiment, a dashed box (upper left corner) circumscribes one such super-VGB structure which is referenced as 201. There are four super-VGB's shown in each super row of FIG. 2 and also four super-VGB's shown in each super column. Each super row or column contains plural rows or columns of VGB's. One super column is identified as an example by the braces at 211. Larger matrices with more super-VGB's per super column and/or super row are of course contemplated. FIG. 2 is merely an example.

As should be apparent from the above discussion, there is a hierarchy of user-configurable resources within each super-VGB. At a next lower level, each super-VGB is seen to contain four VGB's. In the illustrated embodiment, identifier 202 points to one such VGB within SVGB 201.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 204 points to one such CBB within VGB 202.

At a next lower level, each CBB (204) has its own hierarchy of user configurable resources. Some of these will be shown in later figures. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, "VARIABLE GRAIN ARCHITECTURE FOR FPGA INTEGRATED CIRCUITS", whose disclosure is incorporated herein by reference.

It is sufficient for the present to appreciate that each CBB (204) is capable of producing and storing at least one bit of result data and/or of outputting the result data to adjacent interconnect lines. Each VGB (202) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 201).

With respect to the adjacent interconnect lines (AIL's), each SVGB is bounded by two horizontal and two vertical interconnect channels (HIC's and VIC's). An example of a HIC is shown at 250. A sample VIC is shown at 260. Each such interconnect channel contains a diverse set of interconnect lines (e.g., 2×L's-MaxL's) as has already been explained.

The combination of each SVGB (e.g., 201) and its surrounding interconnect resources (of which resources, not all are shown in FIG. 2) is referred to as a matrix tile. Matrix tiles are tiled one to the next as seen, with an exception occurring about the vertical sides of the two central, super columns, 215. Columns 214 (LMC) and 216 (RMC) of embedded memory are provided along the vertical sides of the central pair 215 of super columns. These columns 214, 216 will be examined in closer detail shortly.

From a more generalized perspective, the tiling of the plural tiles creates pairs of adjacent interconnect channels within the core of the device 200. An example of a pair of adjacent interconnect channels is seen at HIC's 1 and 2. The peripheral channels (HIC0, HIC7, VIC0, VIC7) are not so paired. Switch matrix boxes (not shown, see 105 of FIG. 1A) are formed at the intersections at the respective vertical and horizontal interconnect channels. The switch matrix boxes form part of each matrix tile construct that includes a super-VGB at its center.

The left memory column (LMC) 214 is embedded as shown to the left of central columns pair 215. The right memory column (RMC) 216 is further embedded as shown to the right of the central columns pair 215. It is contemplated to have alternate embodiments with greater numbers of such embedded memory columns symmetrically distributed in the FPGA device and connected in accordance with the teachings provided herein for the illustrated pair of columns, 214 and 216.

Within the illustrated LMC 214, a first, special, vertical interconnect channel (SVIC) 264 is provided adjacent to respective, left memory blocks ML0 through ML7. Within the illustrated RMC 264, a second, special, vertical interconnect channel (SVIC) 266 is provided adjacent to respective, right memory blocks MR0 through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 214 or RMC 216. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 is organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (202) and/or to the nibble-wise organization of each group of four CBB's that line the side of each SVGB (201). Thus, there is a data-width match between each embedded memory block and each group of four CBB's or VGB. A similar kind of data-width matching also occurs within the diversified resources of the general interconnect mesh. Each of memory blocks ML0–ML7 and MR0–MR7 can output a respective nibble of data onto lines within its immediately adjacent, HIC (e.g., 250).

At the periphery of the FPGA device 200, there are three input/output blocks (IOB's) for each row of VGB's and for each column of VGB's. One such IOB is denoted at 240. The IOB's in the illustrated embodiment are shown numbered from 1 to 96. In one embodiment, there are no IOB's directly above and below the LMC 214 and the RMC 216. In an alternate embodiment, special IOB's such as shown in phantom at 213 are provided at the end of each memory column for driving address and control signals into the corresponding memory column.

Each trio of regular IOB's at the left side (1–24) and the right side (49–72) of the illustrated device 200 may be user-configured to couple to the nearest HIC. Similarly, each trio of regular IOB's on the bottom side (25–48) and top side (73–96) may be user-configured for exchanging input and/or output signals with lines inside the nearest corresponding VIC. The SIOB's (e.g., 213), if present, may be user-configured to exchange signals with the nearest SVIC (e.g., 264). Irrespective of whether the SIOB's (e.g., 213) are present, data may be input and/or output from points external of the device 200 to/from the embedded memory columns 214, 216 by way of the left side IOB's (1–24) and the right side IOB's (49–72) using longline coupling. The longline coupling allows signals to move with essentially same speed and connectivity options from/to either of the left or right side IOB's (1–24, 49–72) respectively to/from either of the left or right side memory columns.

Data and/or address and/or control signals may also be generated within the FPGA device 200 by its internal VGB's and transmitted to the embedded memory 214, 216 by way of the HIC's and SVIC's 264/266.

The VGB's are numbered according to their column and row positions. Accordingly, VGB(0,0) is in the top left corner of the device 200; VGB(7,7) is in the bottom right corner of the device 200; and VGB(1,1) is in the bottom right corner of SVGB 201.

Each SVGB (201) may have centrally-shared resources. Such centrally-shared resources are represented in FIG. 2 by the diamond-shaped hollow at the center of each illustrated super-VGB (e.g., 201). Longline driving amplifiers (see FIG. 1A) correspond with these diamond-shaped hollows and have their respective outputs coupling vertically and horizontally to the adjacent HIC's and VIC's of their respective super-VGB's.

As indicated above, each super-VGB in FIG. 2 has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB. Another of these processes is implementation of the 4:1 dynamic multiplexer within each CBB as has been mentioned above. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 214/216. Nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by the double-length lines (2×L lines), quad-length lines (4×L lines), octal-length lines (8×L lines) or maximum length longlines (MaxL lines).

In one particular embodiment of the FPGA device, the basic matrix is 10-by-10 SVGB's, with embedded memory columns 214/216 positioned around the central two super columns 215. (See FIG. 2.) In that particular embodiment, the integrated circuit is formed on a semiconductor die having an area of about 120,000 mils$^2$ or less. The integrated circuit includes at least five metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have channel lengths of 0.35 microns or 0.25 microns or less. Amplifier output transistors and transistors used for interfacing the device to external signals may be larger, however.

Figure 3:
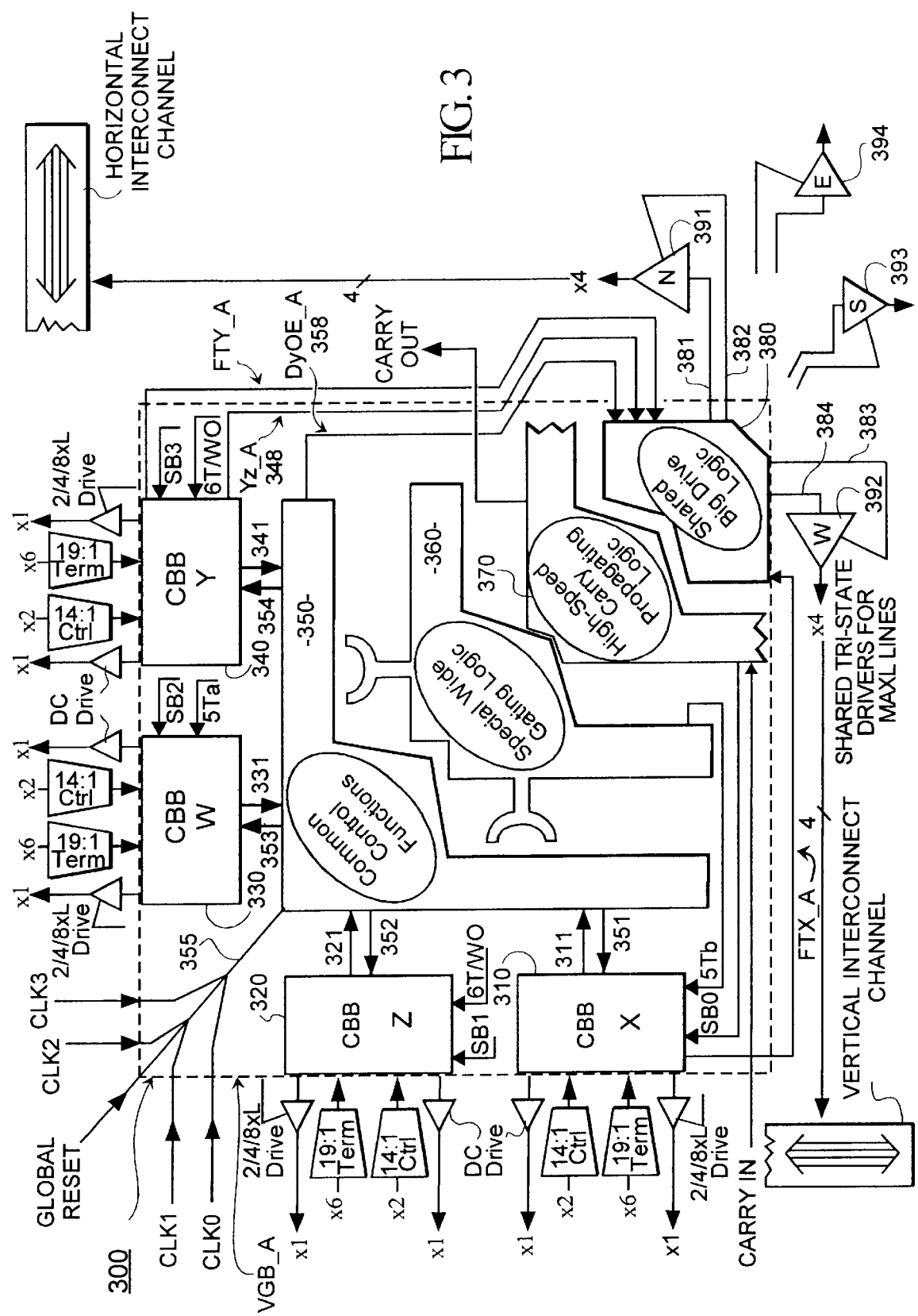
FIG. 3 illustrates an embodiment of one quadrant of a SVGB structure.

As indicated above, each VGB may contain a diverse set of primitive bulding blocks and components for synthesizing larger constructs from these primitives. FIG. 3 shows various details of a first Variable Grain Block 300 (also referred to as VGB(0,0)) at a more microscopic viewing level than that of FIG. 2. It is understood that the other VGB's, namely, _B (0,1), _C (1,0) and _D (1,1,) of each super-VGB have similar resources arranged in respective mirror-opposed symmetry with those of the illustrated VGB_A (0,0).

The common controls developing section 350 collects a first plurality of control signals 311, 321, 331 and 341 from respective CBB's 310 (X), 320 (Z), 330 (W), and 340 (Y). These control signals are acquired by way of respective, controls input multiplexers (14:1 Ctrl) of the respective CBB's X,Z,W,Y. There are two such controls input multiplexers (14:1 Ctrl) dedicated to each CBB. Each pair of controls input multiplexers may be considered an acquisition fingers part of the CBB to which they are dedicated as are the six 19:1 terms input multiplexers (19:1 Term) of each CBB. The dedicated direct-connect (DC) drive amplifier, and the 2/4/8×L drive amplifier od each CBB are also dedicated parts of the respective CBB.

The common controls developing section 350 of FIG. 3 further collects a second plurality of control signals 355 directly from the adjacent horizontal and vertical interconnect channels (HIC and VIC) without using the signal selecting resources (fingers) of the surrounding CBB's. Signals 355 include GR, CLK0, CLK1, CLK2 and CLK3. CLK0 and CLK1 are clock signals that come directly off the vertical interconnect channel. CLK2 and CLK3 are clock signals that come directly off the horizontal interconnect channel. GR is a Global Rest signal that is universally available to all VGB's and therefore has no directional constraints. It is accordingly shown as coming in diagonally into the VGB. Such diagonal disbursement of the GR signal is not generally the best way to distribute GR. It can be alternatively carried in one or both of the vertical or horizontal interconnect channels. In one embodiment, the GR signal is carried by a dedicated GR longline provided in each of the VIC's.

Common controls developing section 350 processes the collected signals 311, 321, 331, 341, and 355, and then returns corresponding common control signals back to the CBB's as indicated by return paths 351 through 354. In one embodiment, individual return paths 351–354 are replaced by a common return bus that transmits the same returned control signals to all the CBB's of the VGB 300.

Common controls developing section 350 of VGB__A also produces a 'for-sharing' dynamic control signal 358 (DyOE__A) which signal is forwarded to the super-VGB's shared logic section 380. A portion of this shared logic section 380 is seen in FIG. 3. It is understood that the common controls sections of the other VGB's within the subsuming super-VGB, namely VGB's: __B, __C, and __D, respectively supply additional for-sharing, dynamic control signals DyOE__B, DyOE__C and DyOE__D (not shown) to shared logic section 380.

Each CBB also directs at least one of its respective output signals to shared logic section 380. Line 348 which feeds signal Yz__A to 380 is an example. It is understood that the remaining CBB's, namely, X, Z, and W of the same VGB__A respectively feed signals Xz__A, Zz__A, and Wz__A to 380. It is further understood that the CBB's of the other VGB's within the subsuming super-VGB, namely VGB's: __B, __C, and __D, respectively supply additional signals of like designations, Xz__J, Zz__J, Wz__J, and Yz__J to their respective sections 380, where __J designates here the respective one of VGB's __B, __C, and __D.

The designation 'DyOE' for signals such as 358 is intended to imply here that such a signal performs an output enabling function and that such a signal additionally performs a dynamic selection function. The designation 'Yz__A' for signals such as 348 is intended to imply here that such a signal may be output by a tri-state amplifier (or another like device having a high-Z/high output-impedance state) such as the illustrated quartet of northern HIC-driving amplifiers 391 and/or such as the illustrated quartet of western VIC-driving amplifiers 392.

Selected ones of the Xz__J, Zz__J, Wz__J, and Yz__J signals may be routed to respective ones of input terminals (e.g., 381 and 384) of the longline driving amplifiers 391 through 394. At the same time, selected ones of the DyOE signals may be routed to respective ones of the output-enable control terminals (e.g., 382 and 383) of the longline driving amplifiers 391 through 394. Shared resources 391 through 394 may thus be used by any of the CBB's for outputting a result signal onto VGB-adjacent longlines. Although FIG. 3 only shows the connections of the respective northern quartet 391 and western quartet 392 of driving amplifiers to the north HIC and west VIC, it is understood that the southern quartet 393 and eastern quartet 394 of driving amplifiers similarly connect to a respectively adjacent, south HIC and east VIC.

Figure 4:
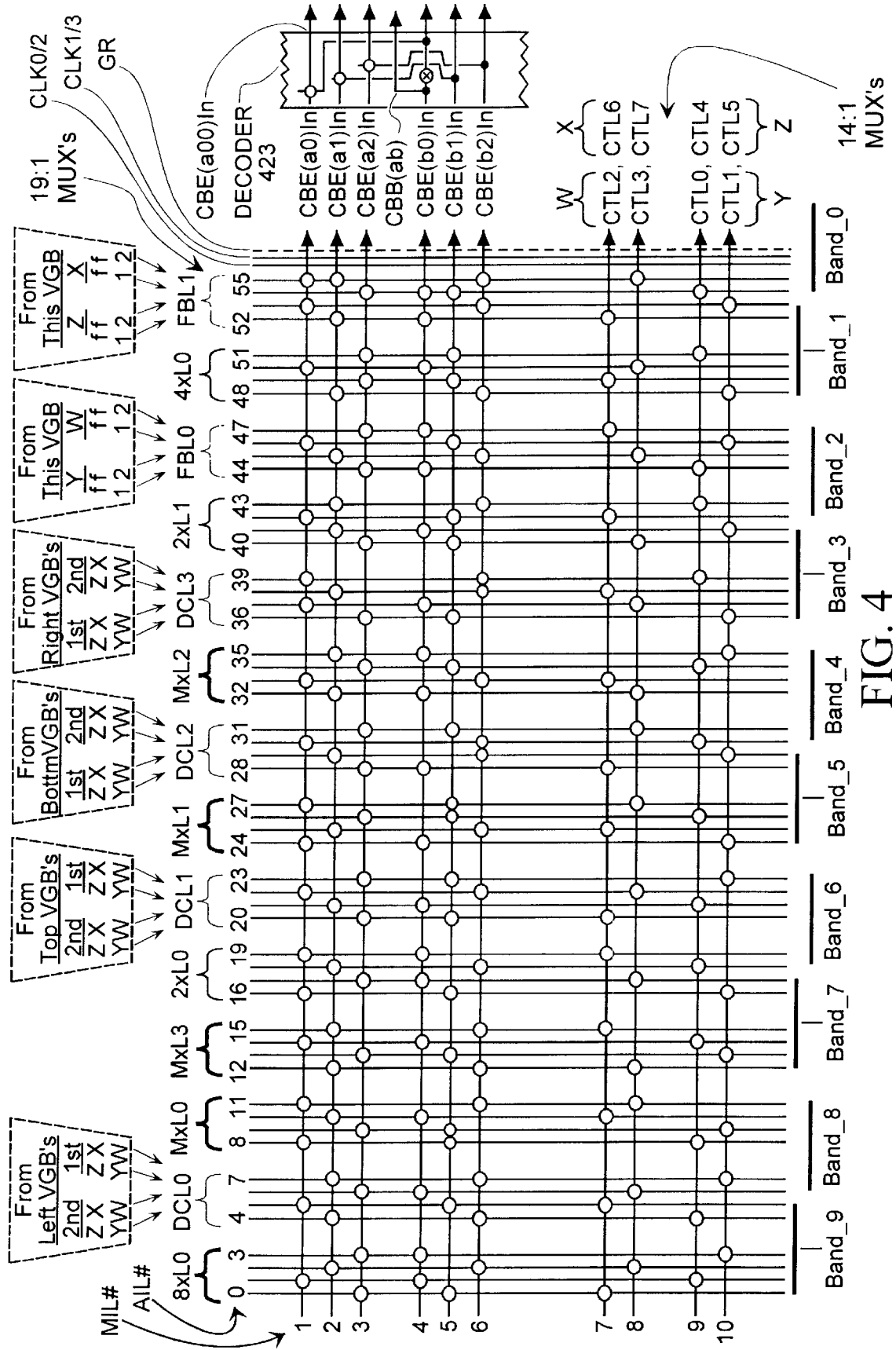
FIG. 4 illustrates an MIL fingers arrangement in accordance with the invention.

FIG. 4 illustrates a partial-populating scheme for the input-term and control-signal acquiring fingers (multiplexers) of the respective X, Z, W, and Y Configurable Building Blocks of one embodiment in accordance with the invention. The adjacent interconnect lines (AIL's) are respectively numbered as 0 through 55. The two dedicated CLK lines of each interconnect channel and the additional GR line in each VIC are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 4 represent the interconnect lines of the next adjacent channel. The exception is at the periphery of the matrix (see FIG. 2) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W.

Multiplexer input lines (MIL's) are numbered in FIG. 4 as 1 through 10. MIL's 1–3 correspond to the three 19:1 input term acquiring multiplexers (fingers) of a first CBE (e.g., 'a') in each of the X, Z, W, Y CBB's. MIL's 4–6 correspond to the three 19:1 input term acquiring multiplexers of a second CBE (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's.

The illustrated partially-populated distribution of PIP's over the intersections of AILS's 0–55 and MIL's 1–10 should be self-explanatory. Each open circle represents a statically-programable interconnect point through which entering lines continue linearly in the schematic. Activation of the PIP creates a closed connection between the crossing-through lines. Deactivation of the PIP during the FPGA configuration phase leaves the crossing-through lines disconnected from one another. The only exception to this is the POP symbol (open circle with an 'X' in it) shown coupled to CBE(b0)In. Activation of the POP (Programmable Opening Point) creates an open circuit between the colinear lines of that symbol. Deactivation of the POP during the FPGA configuration phase leaves the colinear lines of that symbol connected to one another.

AIL's 0–3 represent the four 8×L lines in each interconnect channel. AIL's 4–7 represent a first group (DCL0) of four of the 16 direct connect lines in each interconnect channel. The remaining DCL's are represented by the 20–23 (DCL1), 28–31 (DCL2) and 36–39 (DCL3) sets of AIL's. AIL's 8–11 represent a first group (MxL0) of four of the 16 MaxL lines in each interconnect channel. The remaining MxL's are represented by the 24–27 (MxL1), 32–35 (MxL2) and 12–15 (MxL3) sets of AIL's.

AIL's 16–19 represent a first group (2×L0) of four of the 8 2×L lines in each interconnect channel. The other four 2×L lines are represented by the 40–43 (2×L1) group. AIL's 44–47 represent a first group (FBL0) of four of the 8 feedback lines in each interconnect channel. The other four feedback lines are represented by the 52–55 (FBL1) group. AIL's 48–51 represent the four 4×L lines in each interconnect channel.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next, not immediately-neighboring VGB that is to the left of the current VGB. AIL 4 is driven by either the Z or the Y DC driver of the next-adjacent VGB that is to the left of the current VGB.

Each of MIL's 0–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer. A representative part of that layer is shown at 423.

Note that for each of AIL's 0–55 there are at least two PIP connections to two different MIL's, one of which is placed in the MIL# 1–3 set and another of which is in general, differently placed in the MIL# 4–6 set. In other words, are at least two possible MIL's which can be used to acquire an input term signal moving along a given AIL and feed the acquired signal to one or the other of two possible LUT's ('a' or 'b') of the subsequent primitives layer (see FIG. 5). Thus if one of the two 19:1 multiplexers that can couple to a given AIL is already consumed, or the corresponding LUT is already consumed, the FPGA configuring software has the possibility of alternatively using the other multiplexer and/or LUT for implementing a design circuit chunk that requires a particular input term signal moving along the given AIL.

Each of AIL's 54 and 55 have at least three PIP connections to a respective three different MIL's. Feedback signals from the f1 and f2 lines of the X output element (CSE) therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1)In, CBE(a2)In, CBE(b0)In, CBE(b1)In, and CBE(b2)In in FIG. 4. Note that CBE(b0)In is different from the others in that a POP (Programmable Opening Point) is provided for it in decoder section 423. CBB(ab) represents an intercepted signal that may be used for compounding or folding together the 'a' and 'b' parts of the corresponding CBB to thereby synthesize a larger LUT.

Note also that in the case where the PIP's of the signal-acquiring multiplexers of FIG. 4 are of the bidirectional type, simultaneous activation of two or more PIP's on a same AIL (during FPGA configuration time), creates a bidirectional strapping interconnection between the corresponding MIL's of those PIP's. Such a use of the PIP's of the signal-acquiring multiplexers of FIG. 4 falls herein under the description, 'through-the-AIL strapping'. Not every embodiment however can use this kind of through-the-AIL strapping in a generic way to strap from one MIL to a next a signal that had been generically sourced onto a line other than the strapping AIL. One of the requirements is that the PIP's in the signal-acquiring multiplexers of FIG. 4 be conductive enough (large enough in terms of RC time constant) to get signals through within the system-specified time. If these PIP's are too small, such use of through-the-AIL strapping should be avoided. On the other hand, if the signal that is being strapped onto the two MIL's was sourced onto the strapping AIL from an appropriate AIL drive amplifier, the size of the PIP's of the signal-acquiring multiplexers of FIG. 4 should not be an impediment to carrying on through-the-AIL strapping because the drive amplifier is designed to drive the signal in timely fashion through those loads.

Note further that in the case where the PIP's of the signal-acquiring multiplexers of FIG. 4 are again of the bidirectional type, simultaneous activation during FPGA configuration time of two or more PIP's on a same MIL (multiplexer input line), can create a bidirectional strapping interconnection between the corresponding AIL's of those PIP's. Such a use of the PIP's of the signal-acquiring multiplexers of FIG. 4 is referred to herein as 'through-the-MIL strapping'. The latter function may be particularly useful when a signal is being acquired via a direct connect line (DCL) from another VGB and it is desirable to simultaneously couple such a DCL-carried signal to another kind of AIL within the interconnect channel, say to a vertical 2×L line when the direct connect source was a horizontally displaced VGB. Again, not every embodiment can use through-the-MIL strapping. If the PIP's of the signal-acquiring multiplexers are too small, and the DC drive amplifiers are not powerful enough to drive the added load, the through-the-MIL strapping function should be avoided and other means should be used for routing signals. For example, switch boxes may include PIP's for providing configuration-defined coupling of a signal sourced on a passing-through direct connect line (not shown) to passing-through 2×L, 4×L and/or 8×L lines.

The connection arrangement shown in FIG. 4 illustrates one possible layout arrangement for the various, differentiated conductors of the interconnect channel. This layout organization is formed by spaced-apart, layout 'bands' 0 through 9 as shown at the bottom of FIG. 4. Each band (except 0) has 6 adjacent interconnect lines (AIL's) and generally 2 PIP's per multiplexer input line (MIL). Other layouts are of course possible.

Note that the lines of band 0 are positioned closest to the side of the corresponding CBB. This helps to minimize the distance that timing-critical signals such as CLK0-3 and GR (global reset) travel from a CBB source before entering into the CSS of a destination CBB. The lines of bands 1 and 2 are positioned successively next closest to the side of the corresponding CBB. This helps to minimize the length of VGB-circumscribing lines, particularly the so-called, feedback lines (of groups FBL0 and FBL1). The quad-length (4×L0) lines may be used to facilitate certain signal-strapping functions of an adjacent decoding layer 423, which is why the 4×L0 lines are also included in band 1. MaxL lines and direct connect lines (DCL's) tend to have substantially larger capacitances than FBL's and 2×L lines.

The MaxL lines and DCL's are thus generally relegated to positions in the outer-more ones of bands 3–9 because distance of signal travel from a source CBB to a destination CBB, through one of these larger-capacitance conductors is less critical.

When the PIP-distribution scheme of FIG. 4 is used, each of the control-signal acquiring multiplexers MIL's 7–10 allows it s respective CBB to acquire control signals from a unique subset of lines in respective one or the other of its adjacent HIC or VIC.

Figure 5A:
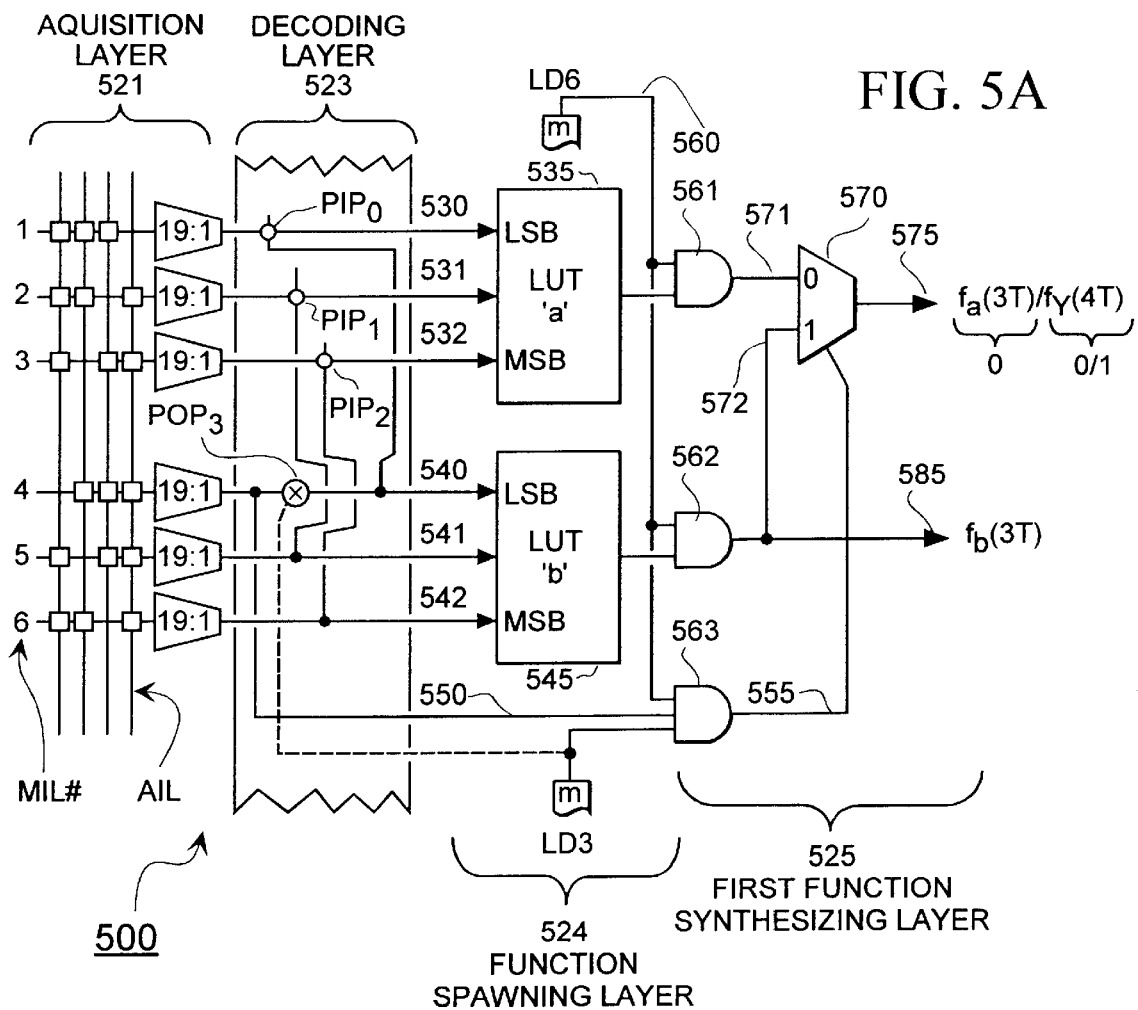
FIG. 5A is a schematic showing two primitive, function spawning LUT's (configurable building elements or CBE s) in accordance with the invention and the means by which they can be folded-together to synthesize higher-order functions.

Referring to FIG. 5A, the same representative part of the decoding layer that was shown as 423 in FIG. 4 is now shown at 523. The next layer after the decoding layer 523 is named here as a function spawning layer 524. This function spawning layer 524 contains a set of function spawning lookup tables (LUT's 535 and 545). A first function synthesizing layer is shown at 525 as being coupled to both the decoding layer 523 and the function spawning layer 524. Functions of the 'a' and 'b' LUT's (535 and 545) may be programmably folded-together, as will be explained, to synthesize a higher order function. The circuit 500 of FIG. 5A represents a function generating part of a CBB. Each VGB and SVGB has deeper function synthesizing layers (not shown) for further folding-together the outputs of the first function synthesizing layers of respective CBB's to synthesize yet higher order functions. Details concerning such folding-together operations and concerning the deeper synthesizing structures of SVGB's may be found in at least one of the above-cited patent applications.

The input-term signals acquiring layer of CBB circuit 500 is shown at 521 to include the 19:1 static multiplexers formed on respective MIL's (fingers) 1–6. MIL's 1–6 can supply a respective subset of six or fewer acquired signals to decoding layer 523.

Decoding layer 523 includes first through third programmable interconnect points, $PIP_0$, $PIP_1$ and $PIP_2$. The corresponding configuration memory bits of these PIP's are not shown. $PIP_0$ may be used for programmably establishing a link between LUT input line 530 and LUT input line 540. $PIP_1$ may be used for programmably establishing a link between line 531 and line 541. $PIP_2$ may be used for programmably establishing a link between line 532 and line 542.

Decoding layer 523 further includes a programmable opening point designated as $POP_3$. The corresponding configuration memory bit of $POP_3$ is shown at LD3 and the controlling connection from LD3 to $POP_3$ is indicated by a dashed line. $POP_3$ may be used for programmably breaking a connection between MIL# 4 and LUT input line 540. Since each of $PIP_0$, $PIP_1$, $PIP_2$ and $POP_3$ is independently configurable, a number of different operating modes are possible.

In a first mode (the transparent decoding mode), all of PIP's 0, 1 and 2 are deactivated so as to not make respective connections between lines 530 and 540, between lines 531 and 541, between lines 532 and 542. POP 3 is also deactivated so as to not create a respective opening between MIL# 4 and line 540. The respective 3 output signals of the top three 19:1 multiplexers (MIL's 1–3) then couple to the respective 3 input terminals (530–532) of LUT 535 in this transparent decoding mode. At the same time, the respective 3 output signals of the bottom three 19:1 multiplexers (MIL's 4–6) couple to the respective 3 address input terminals (540–542) of LUT 545. Note for the case where PIP's take on the bidirectional configuration, that the capacitive loads of each of MIL's 1–3 are not added to the capacitive loads of respective ones of MIL's 4–6 in the transparent decoding mode. Thus propagation times for input term signals acquired from the adjacent interconnect lines (AIL's) to the inputs of LUT's 'a' (535) and 'b' (545) can be relatively small.

Note that the number of 19:1 multiplexers (MIL's 1–6) matches the number of independent LUT inputs, 530–532 and 540–542. When the transparent decoding mode is active, each 19:1 multiplexer of the acquisition layer 521 is efficiently consumed by a corresponding one of LUT inputs, 530–532 and 540–542. Thus there is a balanced match of signal acquiring resources (521) and signal consuming resources (524) when the transparent decoding mode is active.

In the transparent decoding mode, LUT 535 produces a three input-term, $f_a$ (3T) function signal in response to its respective 3 inputs as fed in from MIL's 1–3. LUT 545 produces a $f_b$(3T) function signal in response to its respective 3 inputs as fed in from MIL's 4–6.

The first function synthesizing layer 525 includes first through third AND gates 561–563, a dynamic multiplexer 570 and a default line 560 that is driven by configuration memory bit LD6. Each of AND gates 561–563 has an input connected to default line 560 so that a logic 0 in configuration memory bit LD6 forces logic 0 outputs from AND gates 561–563. (An alternate embodiment could use OR gates and reverse logic, of course.) Configuration memory bit LD6 should be set to logic 1 when circuit section 500 is being used for a function spawning process.

On the other hand, if section 500 is not being used, LD6 should be set to the logic 0 state by the FPGA configuring software and at the same time, all the MIP's of the corresponding 19:1 multiplexers should be left open (inactivated). This provides advantages. First, the FPGA configuring software does not have to spend significant time tying up loose ends for unused sections so as to eliminate switching noise from such loose ends. Second, the capacitive loadings of MIL's 1–6 are not added to the overall capacitances of the adjacent interconnect lines (AIL's). Third, elements of unused sections such as the LUT's may be placed in a power-saving, high impedance state.

As explained above, configuration memory bit LD3 is at logic 0 in the transparent decoding mode. One input of AND gate 563 is driven by bit LD3. Output 555 of AND gate 563 therefore drives the select control terminal of multiplexer 570 to output the signal of its input 571, which input passes through AND gate 561 from the output of LUT 535. Dynamic multiplexer 570 therefore outputs the $f_a$ (3T) signal onto line 575 when the transparent decoding mode is present and LD6 is active (set to logic 1). At the same time, AND gate 562 outputs the $f_b$ (3T) signal onto line 585. Signals $f_a$ (3T) and $f_b$ (3T) are of course determined by user-configuration of the configuration memory bits in LUT's 'a' and 'b'. One such possible configuration is to make each of LUT's 'a' and 'b' behave as a 2:1 dynamic multiplexer. See FIG. 5B.

In a second mode (the fully-strapped decoding mode), each of $PIP_0$, $PIP_1$, and $PIP_2$ is activated so as to make respective connections between line 530 and 540, between line 531 and 541, between line 532 and 542. $POP_3$ is also activated so as to create a respective opening between MIL# 4 and line 540. The respective 3 output signals of the top three 19:1 multiplexers (MIL's 1–3) may then couple to the respective 3 input terminals (530–532) of LUT 535 and also to the respective 3 input terminals (540–542) of LUT 545 in this fully-strapped decoding mode. The MIP's of 19:1 multiplexers 5 and 6 should be left deactivated (not connecting) in this mode. One MIP of 19:1 multiplexer 4 (MIL# 4) should be activated to bring an acquired input term signal onto line 550.

As a slight variation on the above mode, the corresponding MIP's of either one of 19:1 multiplexers #2 and #3 is left deactivated (not connecting) while a MIP in a respective one of 19:1 multiplexers #5 and #6 is activated. The combinations of possibilities means that the input term signal acquiring capabilities of MIL's #2 and #5 are folded together and that the input term signal acquiring capabilities of MIL's #3 and #6 are folded together. As seen in FIG. 4, MIL# 5 may acquire input term signals from adjacent interconnect lines different than those serviced by MIL# 2. Similarly, MIL# 6 may acquire input term signals from adjacent interconnect lines different than those serviced by MIL# 3.

AND gate 563 couples the acquired input term signal of line 550 to the select control terminal of dynamic multiplexer 570 in this fully-strapped decoding mode. The second input 572 of multiplexer 570 is coupled to line 585. Output line 575 accordingly produces $f_a$ (3T) when the acquired input term signal of line 550 is logic 0 and it produces $f_b$ (3T) when the acquired input term signal of line 550 is logic 1. With appropriate use of the signal on MIL# 4 as the most significant address bit for a desired 16-bit LUT and the signals on MIL's 1–3 as the less significant address bits, section 500 functions as a 16-bit LUT that outputs $f_Y$(4T) on line 575 in this fully-strapped decoding mode. The emulated 16-bit LUT has input term acquiring capabilities greater than those of the individual 'a' and 'b' LUT's because of the exchangeability of 19:1 multiplexers #2 and #5, and because of the exchangeability of 19:1 multiplexers #3 and #6.

In the fully-strapped decoding mode, output line 585 continues to output the $f_b$ (3T) function signal. As such, for overlapping ones of $f_Y$(4T) and $f_b$ (3T), section 500 can simultaneously function as both a 16-bit LUT that outputs $f_Y$(4T) and an 8-bit LUT that outputs $f_b$ (3T).

Figure 5B:
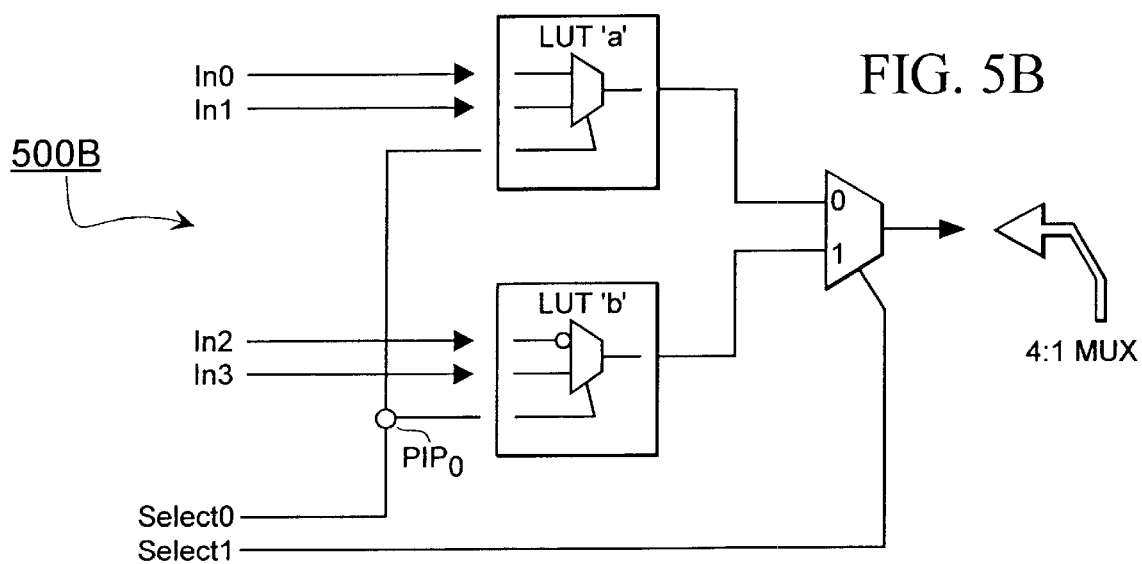
FIG. 5B is a schematic showing how two primitive, function spawning LUT's can be folded-together to synthesize a four-to-one dynamic multiplexer (4:1 DyMUX)

Referring to FIG. 5B, a third decoding mode is referred to herein as the 4:1 DyMUX-emulating mode. In this third mode, $PIP_0$(of FIG. 5A) is activated to make a connection while $PIP_1$ and $PIP_2$ are each deactivated. $POP_3$ is activated to make an opening between MIL# 4 and line 540. In one variation of this third decoding mode, LUT's 'a' and 'b' are configured to each behave as a 2:1 dynamic multiplexer with lines 530 and 540 being the respective selection control lines. These lines 530 and 540 are strapped together by the activated $PIP_0$ to define a Select0 control line of a synthesized 4:1 dynamic multiplexer (4:1 DyMUX). MIL# 4 (550) becomes the Select1 control line of the 4:1 multiplexer as shown while MIL's 2, 3, 5 and 6 define desired ones of inputs In0, In1, In2 and In3 of the illustrated 4:1 dynamic multiplexer. As should now be apparent, any one or more of the In0, In1, In2 and In3 inputs can behave as an inverting input to the synthesized 4:1 DyMUX by appropriate configuration of the underlying LUT's 'a' and 'b'. In a variation on FIG. 5B, one of input pair In0–In2 and pair In1–In3 can be strapped together by activating the corresponding one of $PIP_1$ and $PIP_2$.

Of importance, it should be observed that the synthesized 4:1 DyMUX 500B of FIG. 5B makes highly efficient usage of the available resources within CBB section 500 (FIG. 5A). MIL's #2, #3, #5 and #6 respectively acquire input data signals In0, In1, In2 and In3. MIL #1 acquires the first control signal, Select0. MIL #4 acquires the second control signal, Select1. Thus all input-term acquiring MIL's are used. All three inputs of each of LUT's 535 ('a') and 545 ('b') are used to control the output result signal 575. Thus none of the lookup capabilities of the LUT's are wasted. This is to be contrasted with cases where one or more of the inputs of each of LUT's 535 and 545 operate as don't care terminals. Additionally, any one or more or none of the In0, In1, In2 and In3 inputs can be made to behave as an inverting input to the synthesized 4:1 DyMUX. Thus the function spawning capabilities of the LUT's can be used to carry out desired inversion functions in addition to the 2:1 DyMUX of each LUT. If a same input signal is to appear twice at the four inputs of the 4:1 DyMUX 500B, perhaps once in inverted form and the second time in non-inverted form, a corresponding one of decoding layer $PIP_1$ and $PIP2$ may be used to respectively strap-together MIL's #2 and #5, or #3 and #6. Since MIL's #2 and #5 have differntly located MIP's (square open boxes in FIG. 5A, see also FIG. 4), the routing software that configures the FPGA can take advantage of this to find more opportunities for routing a desired signal to one of the inputs of the synthsized 4:1 DyMUX 500B.

Figure 5C:
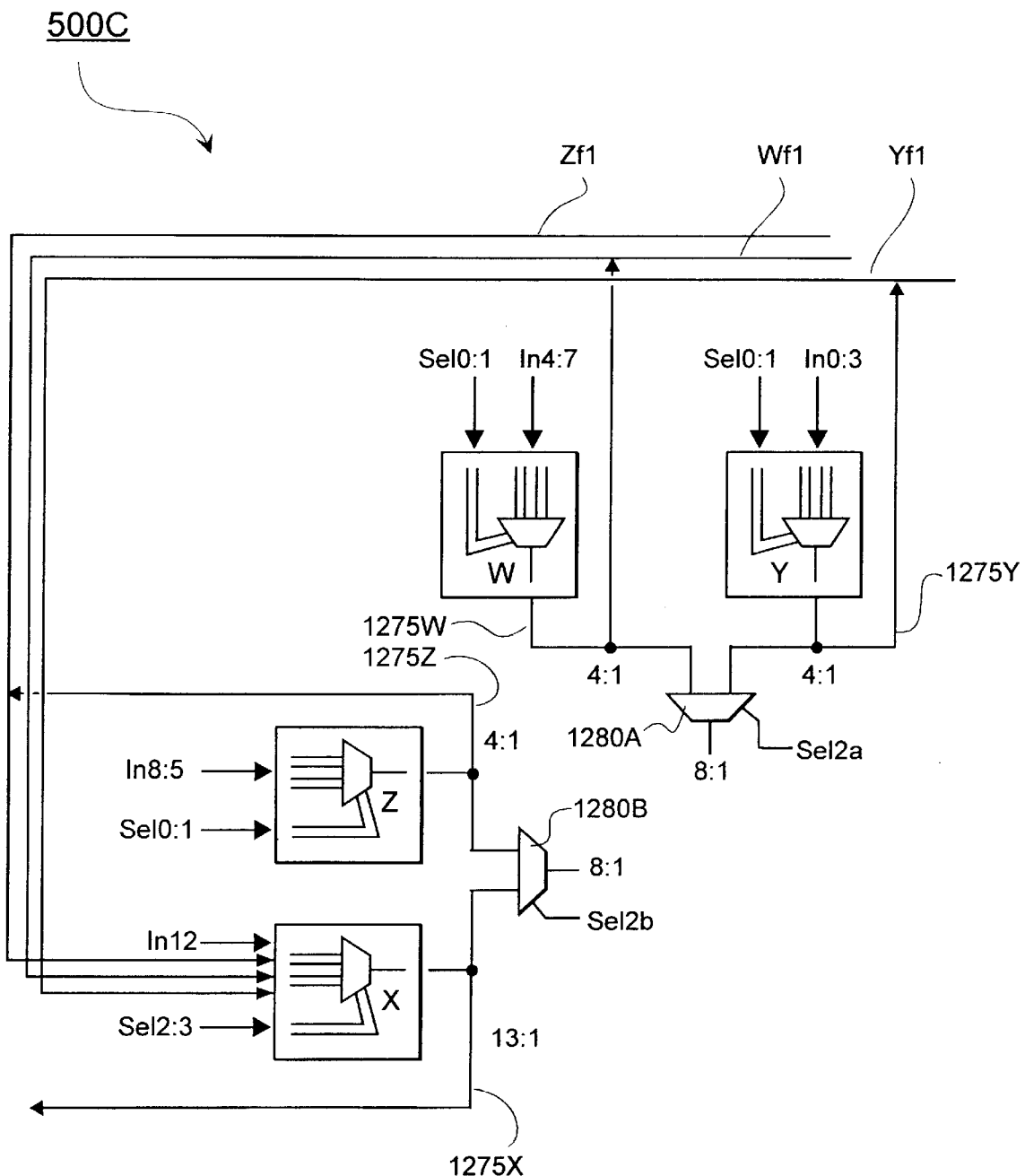
FIG. 5C is a schematic showing how a quartet of less primitive, CBB elements (Configurable Building Blocks) can be combined to synthesize an 8:1 DyMUX, a 10:1 DyMUX, and a 13:1 DyMUX.

Referring to FIG. 5C, it will now be shown how a combination 500C of four synthesized 4:1 DyMUX circuits, each being formed by the method shown in FIG. 5B, may be used to granularly-wise emulate within a given VGB either: (a) a single 13:1 multiplexer, or (b) a combination of a 10:1 multiplexer and a 4:1 multiplexer, or (c) a combination of an 8:1 multiplexer and two 4:1 multiplexers, or (d) a combination of two 8:1 multiplexers, or (e) a combination of four 4:1 multiplexers.

The last three combinations, (c), (d) and (e) are fairly straightforward. For combination (e), each of the X, Z, W, and Y Configurable Building Blocks of the given VGB independently emulates a 4:1 multiplexer having its respective inputs: In0, In1, In2 and In3 (denoted as In0:3) and further having its respective selection controls: Sel0 and Sel1 (denoted as Sel0:1).

To emulate an 8:1 multiplexer, two 4:1 multiplexers such as Y and W in FIG. 5C have their respective selection controls strapped together to simultaneously receive Sel0:1. Selectable input sets In0:3 and In4:7 are coupled to respective inputs of the Y and W 4:1 multiplexers. VGB intraconnect lines such as 1275Y and 1275W couple the 4:1 selections to a next level multiplexer 1280A within the VGB function synthsizing layers. A third selection signal, Sel2a supplements the Sel0:1 signals to form the 8:1 multiplexer output at the output of next level multiplexer 1280A.

It should now be apparent that an 8:1 multiplexer may be similarly formed along the other leg of the same VGB using Z and X, and a second, next level multiplexer 1280B. Also, a pair of 4:1 multiplexers may be implemented on one leg while an 8:1 multiplexer is implemented on the other leg.

A single 13:1 multiplexer may be formed as follows, using feedback lines Yf1, Wf1 and Zf1 of the given VGB. Each of CBB's X, Z, W, and Y implements a 4:1 multiplexer. CBB's Z, W, and Y receives selection control signals Sel0:1 as shown in FIG. 5C. Y receives input signal set In0:3. W receives input signals set In4:7. Z receives input signals set In8:11. X receives input signal In12 at one of its four inputs and the outputs of the 4:1 multiplexers Z, W, and Y at its other three data inputs. The latter 3 signals may be transferred by way of local feedback lines Yf1, Wf1 and Zf1 or by other VGB intraconnect or interconnect means as appropriate. The two selection control inputs of the X 4:1 multiplexer receive selection control signals Sel2:3. These may dynamically select either one of twelve data signals, In0:11 passed through respective ones of 4:1 multiplexers Z, W, and Y or the thirteenth data signal, In12 for output onto line 1275X.

Formation of combination (b), which has a 10:1 multiplexer and a 4:1 multiplexer takes a similar approach. This time, the outputs of Y and W feed 2 inputs of X while the remaining 2 inputs of X receive the ninth and tenth data input signals. The two selection control inputs of the Z 4:1 multiplexer may receive independent selection control signals instead of Sel0:1. Thus Z becomes an independent 4:1 multiplexer that resides in a same VGB with a 10:1 multiplexer. Selection control inputs of the Y and Z 4:1 multiplexers may be strapped together to form a 10:1 multiplexer that uses Y and Z to receive the first 8 of the 10 data input signals. Any 3 of the CBB's in a VGB may be used to form a 10:1 multiplexer as desired.

The dynamic multiplexers depicted by FIG. 5A, 5B or 5C may be used for a wide variety of run-time functions. Each CBB of FIG. 2 includes a configurable sequential element (CSE) such as the one 60Y shown in FIG. 6. Outputs of the 2:1 DyMUX's (each implemented in a respective LUT of FIG. 5B), the 4:1 DyMUX's (FIG. 5B) and the other N:1 DyMUX's (FIG. 5C) may be sequenced to further circuitry of the FPGA through and appropriate CSE.

Figure 6:
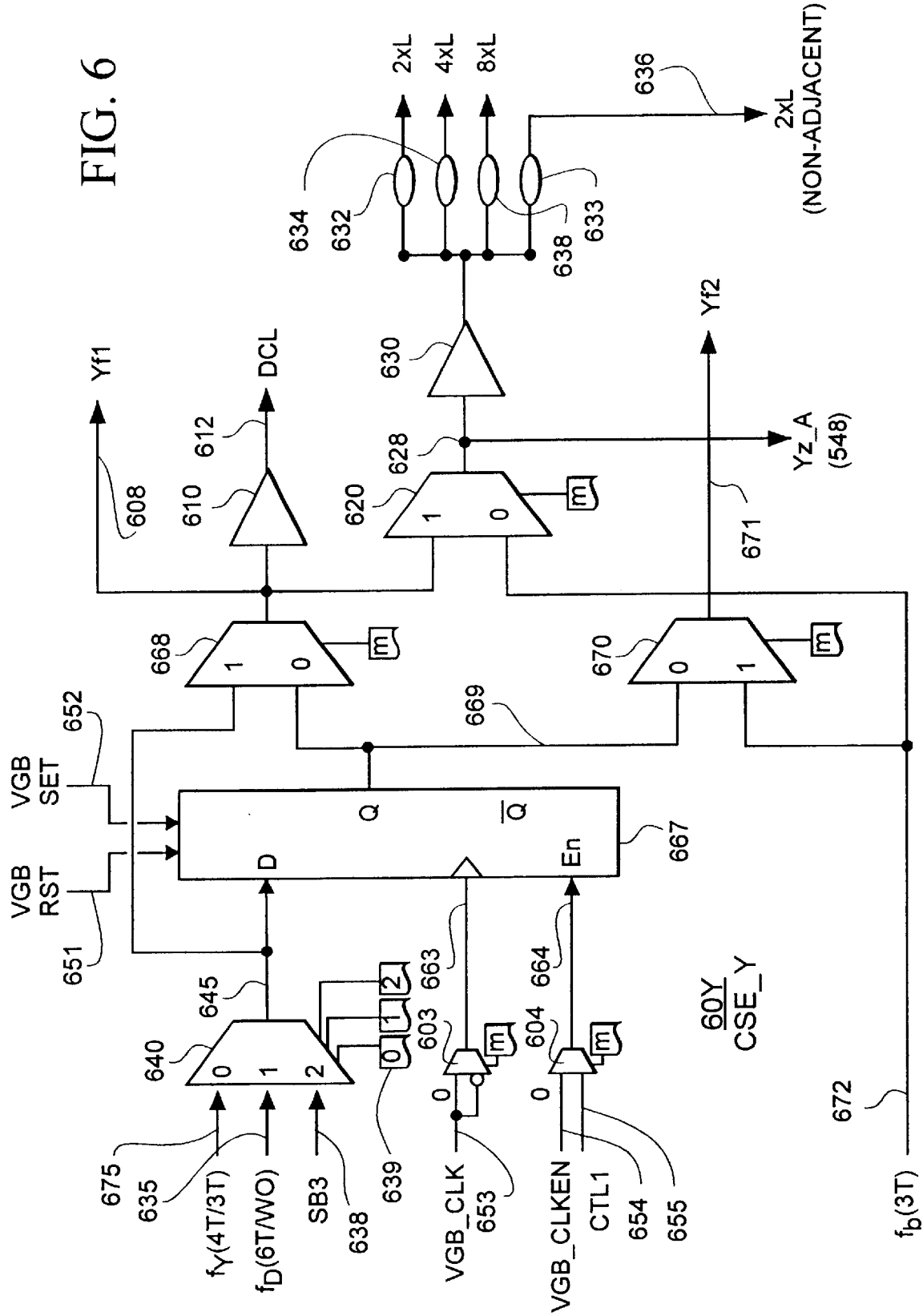
FIG. 6 is a schematic of a Configurable Sequential Element (CSE) that stores and outputs signals produced by the function synthesizing layers of a corresponding VGB (Variable Grain Block)

In FIG. 6, the outputs of the 2:1 DyMUX's ('a' and 'b') may respectively appear on lines 675 and 672 as signals $f_a$ (3T) and $f_b$ (3T). The output of a synthesized 4:1 DyMUX may appear on line 675 as signal $f_Y$ (4T). The output of a synthesized 8:1 DyMUX may appear on line 635 as signal $f_D$ (6T).

Each CSE includes a data storing flip-flop 667. Flip-flop 667 receives reset (RST) and set control signals 651 and 652 in addition to clock signal 663 and clock enable signal 664. A locally-derived control signal CTL1 is represented at 655 while a VGB common enable is presented on line 654. Multiplexer 604 is programmably configurable to select one or the other of lines 654, 655 for presentation of the selected input signal onto output line 664. Lines 672, 675, 635 and 638 carry logic block (CBB) result signals which are not directly germane to the present invention. A more detailed explanation of such CBB-result signals may be found in at least one of the above-cited, copending applications.

Three bits of configuration memory are indicated at 639 for controlling multiplexer 640 to select an appropriate data signal 645 for supply to the D input of flip-flop 667. The selected signal may bypass the flipflop by routing through multiplexer 668 to line 608. Multiplexer 668 may be programmed to alternatively apply the Q output of flip-flop 667 to line 608. Buffer 610 drives a direct-connect line 612. Buffer 630 drives one or more of CBB-adjacent 2×L, 4×L or 8×L lines. Connection 636 is to a non-adjacent 2×L line. Items 632, 633, 634 and 638 represent PIP-like, programmable connections for programmably interconnecting their colinear lines. A more detailed explanation of the CSE structure and its other components may be found in at least one of the above-cited, copending applications.

Figure 7A:
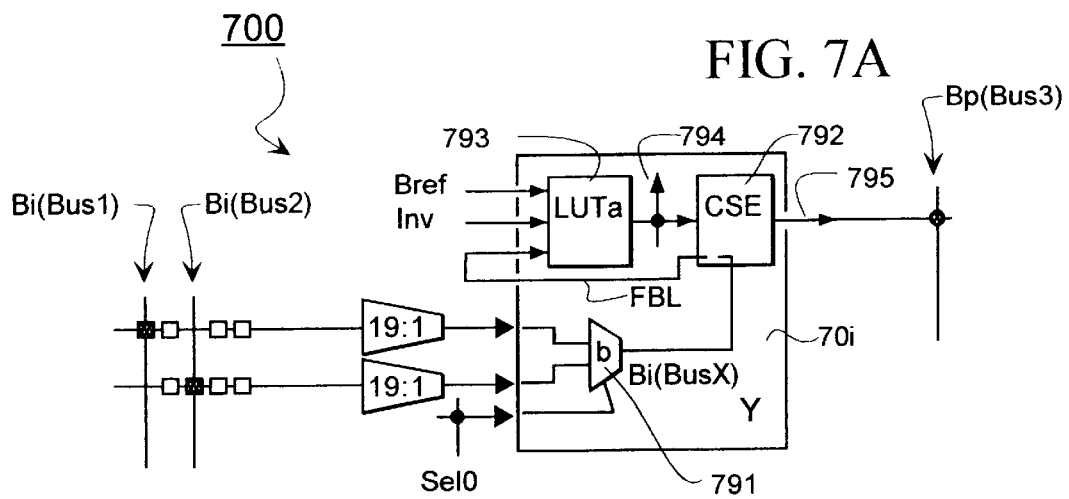
FIG. 7A is a schematic showing how two primitive, function spawning LUT's can be used to efficiently synthesize a 2:1 DyMUX and further, post-multiplexing processing logic.

FIG. 7A shows a schematic portion 700 of one use of a synthesized 2:1 DyMUX 791 where the use includes post-multiplexing processing. Here LUT 'b' implements the 2:1 dynamic multiplexer 791 in one or more respective CBB's such as 70i. In this illustrative application the 2:1 DyMUX 791 is used for dynamically selecting a respective bit Bi from one of two AIL's. The two AIL's are respectively associated with two buses, Bus_1 and Bus_2. Each of AIL's can be any kind of conductor, including a MaxL line, a 8×L line, a 4×L line, or a direct connect line. (Because they are shorter, feedback lines and 2×L lines are generally not used for constructing, signal-broadcasting buses.) The bit Bi(BusX) that is dynamically selected by DyMUX 791 is sent a first time into CSE 792 as signal $f_b$ (3T). CSE 792 is configured to return the selected bit, Bi(BusX) via a local feedback line (FBL) to one of three inputs of LUTa (793) of the same CBB 70i. LUTa 793 may perform a desired, post-selection processing function comensurate with the capabilities of LUTa prior to supplying a respective $f_a$ (3T) result signal back to CSE 792 for final output. The respective $f_a$ (3T) result a signal may be stored in a register of the CSE and/or output 795 to one or more of the interconnect lines driven by CSE 792. The AIL('s) that is/are driven 795 by CSE 792 can define a Bus3 and can be any kind of conductor, including a MaxL line, a 8×L line, a 4×L line, a 2×L line, or a direct connect line. Connection 794 represents another path by way of which the $f_a$ (3T) signal could be sent into deeper parts of the VGB for further processing, such as for forming an input to a 16bit VGB common LUT (not shown, has 4 inputs) that may be found in each VGB.

As such, a compact and highly efficient structure 700 is illustrated by FIG. 7A wherein each of plural CBB's (only one shown as representative CBB 70i) perform dynamic multiplexing (791), post-multiplexer processing (793/794) and registered or combinatorial outputting (795) of the result signal to a subsequent conductor (Bus3).

One example of a possible, post-multiplexing process (that is given here for illustrative purposes) is to perform a bit comparison test in LUTa 793. Bref is a supplied reference bit of comensurate significance to the selected bit, Bi(BusX) tha is present on feedback line FBL. Input Inv tells LUTa whether or not to invert test bit Bi(BusX) prior to performing an exclusive-NOR operation with reference bit Bref. Such inversion might be desired because one of Bus_1 and Bus_2 uses positive logic while the other uses 1's complement logic. The $f_a$ (3T) result signal is then a logic '1' if the optionally-inverted test bit Bi(BusX) matches the reference bit Bref. The $f_a$ (3T) result signal is otherwise a logic 101 if there is no match.

The 16bit VGB common LUT (not shown, has 4 inputs) recieves in addition to the $f_a$ (3T) signal from CBE 'a' of CBB Y, a corresponding $f_c$ (3T) signal from a CBE 'c' of CBB W. a corresponding $f_e$ (3T) signal from a CBE 'e' of CBB Z. and a corresponding $f_g$ (3T) signal from a CBE 'g' of CBB X of the same VGB. The 16bit VGB common LUT (not shown) can be therefore programmably-configured to recognize and signal predefined patterns in two or more of the match/no-match signals, $f_a$ (3T), $f_c$ (3T), $f_e$ (3T) and $f_g$ (3T) developed by a respective two or more of the X, Z, W, and Y of the same VGB. The higher-level, pattern recognition signal $f_D$ (6T/WO) (see FIG. 6) can then be stored in and output 795 through one of the CSE's 792 of the VGB to a driven AIL (Bus_3). FIG. 7A therefore provides an example therefore of a highly efficient way of taking advantage of the variable granularity of resources and interconnect capabilities provided not only in each CBB, but also in each VGB to provide: dynamic multiplexing (791), higher-ordered post-multiplexing processing (794), and result storage and/or output (792).

Figure 7B:
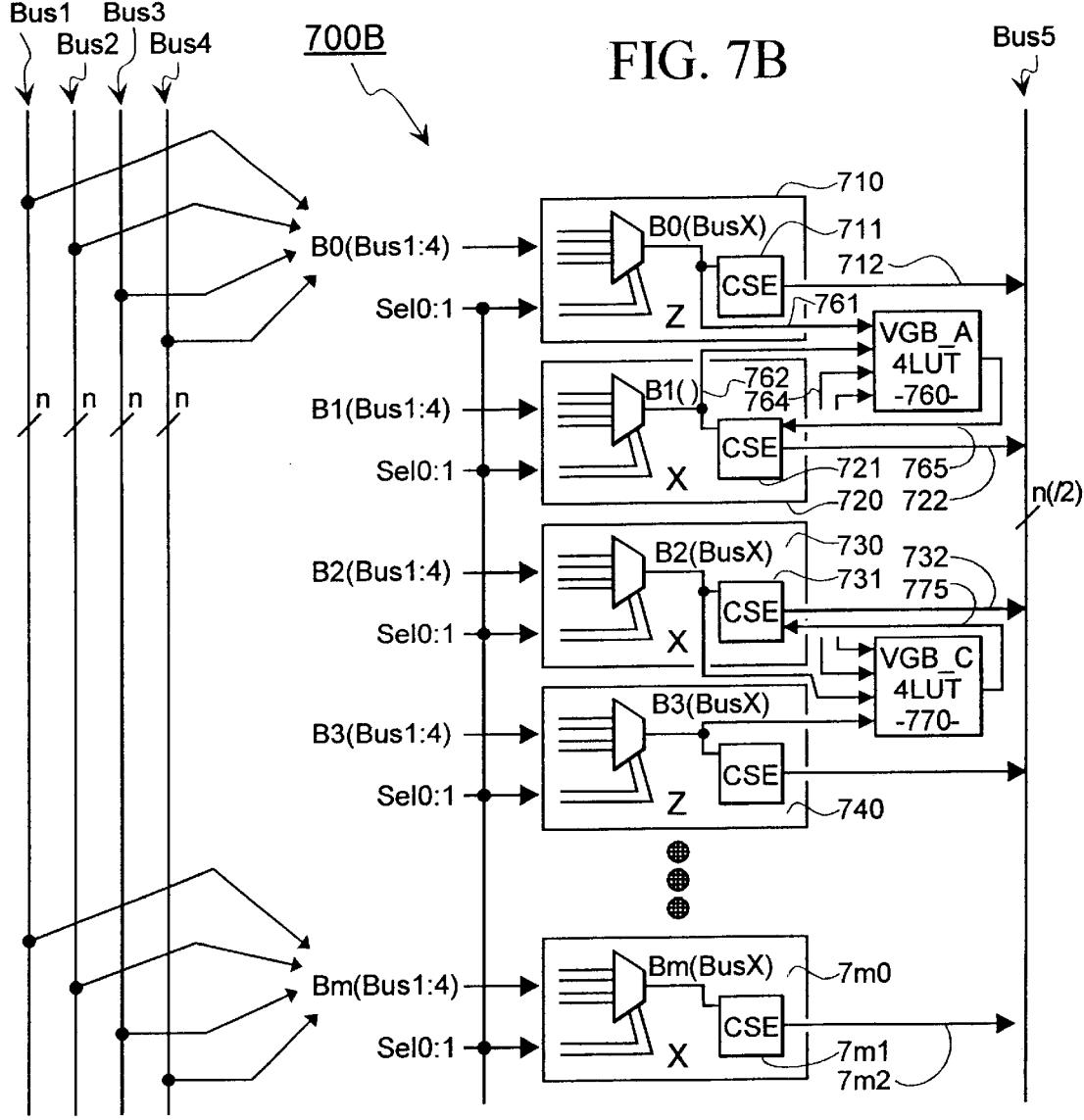
FIG. 7B is a schematic showing how plural ones of less primitive, CBB's can be combined to synthesize 4:1 DyMUX's and further, post-multiplexing processing logic.

In FIG. 7A, LUTa (793) was used to provide post-multiplexing processing. Such post-multiplexing processing is possible (to a lesser extent) even if the resources of LUTa are used to synthesize a 4:1 DyMUX. In FIG. 7B, each of Bus1 through Bus4 has n independent lines carrying respective bits B0 through Bm of that bus (m=n−1). In one configuration, Bus5 also has n independent lines carrying respective bits B0 through Bm of that bus. In an alternate configuration (that uses VGB common LUT's 760 and 770), Bus5 has n/2 independent lines. Each line of Bus1 through Bus5 may be implemented by a 2×L, 4×L, 8×L or MaxL line within one or more vertical interconnect channels (VIC) or by direct connect lines. CBB 710 (a Z CBB inside VGB_A) is configuration-defined to implement a first 4:1 DyMUX in accordance with FIG. 5B. The four data input terminals of the 4:1 DyMUX in CBB 710 respectively coupled to the bit B0 line of each of respective buses Bus1 through Bus4. The two dynamic selection terminals of the 4:1 DyMUX in CBB 710 are coupled to receive selection signals Sel0:1 for dynamically selecting one of Bus1 through Bus4.

In a first configuration, the dynamically selected bit, B0(BusX) is next forwarded through CSE 711 of the Z CBB to the corresponding bit B0 line of Bus5 by way of output connection 712.

In the same first configuration, CBB's 720, 730, 740, ..., 7m0 of FIG. 7B are similarly configured and connected to steer respective bits B1, B2, B3, ... Bm onto Bus5 from a dynamically selected one of buses Bus1 through Bus4 in accordance with selection signals Sel0:1. Bus5 may then further couple the steered signals to further processing means (e.g., an n-bit adder). Note that CBB's 710 (Z), 720 (X), 730 (X), and 740 (Z) are in a same super-VGB, each adjacent to a same VIC. Of course it is also contemplated to provide for dynamic data path steering by using 4:1 multiplexers implemented in the Y and W CBB's, as is convenient for partitioning, placement and routing concerns.

In a second configuration, the dynamically selected bit, B0(BusX) of CBB 710 is next forwarded by way of path 761 to a 16bit VGB_common LUT 760 that is inside the VGB_A of CBB's 710 and 720. The VGB_common LUT 760 has four inputs. Its second input 762 recieves the B1(BusX) bit that is dynamically multiplexed by CBB 720. Its third and fourth inputs (denoted as 764) can either function as don't cares or can receive control signals from the W and Y CBB's (not shown) of the same VGB_A.

The VGB common LUT 760 processes its inputs in accordance with its pre-programmed configuration and then outputs a higher-order result signal onto line 765. For example, one such pre-programmed configuration may cause 765 to go high (logic '1') only if both of 761 and 762 are logically the same (thus performing an XOR operation) and to otherwise go low. Line 765 returns the higher-order result signal to CSE 721 for output onto line 722. As another example, the pre-programmed configuration of LUT 760 may cause it to include the emulation of a 2:1 DyMUX that dynamically selects one or the other of the signals on lines 761 and 762. One of the remaining lines of pair 764 can function as a select control for the 2:1 DyMUX while the other can dynamically control yet another function such as inversion or noninversion of the result output on line 765.

In the adjacent VGB_C of the same SVGB, CBB's 730 and 740 are similarly configured so that the 16bit VGB_common LUT 770 inside that VGB_C performs post-multiplexing processing and then forwards the result signal 775 to CSE 731. CSE 731 then forwards its output 732 to a corresponding AIL of Bus5.

This configuration pattern may repeat vertically down to include CSE 7m1 of CBB 7m0. CSE 7m1 forwards its output 7m2 to a corresponding AIL of Bus5. Again, although the second configuration that uses pattern recognizers 760 and 770 is shown extending vertically to use the Z and X CBB's for synthesizing 4:1 DyMUX's, it is also within the contemplation of the invention to provide for such dynamic data path steering and post-steering processing by using 4:1 multiplexers implemented in the Y and W CBB's, as is convenient for partitioning, placement and routing concerns.

Figure 8:
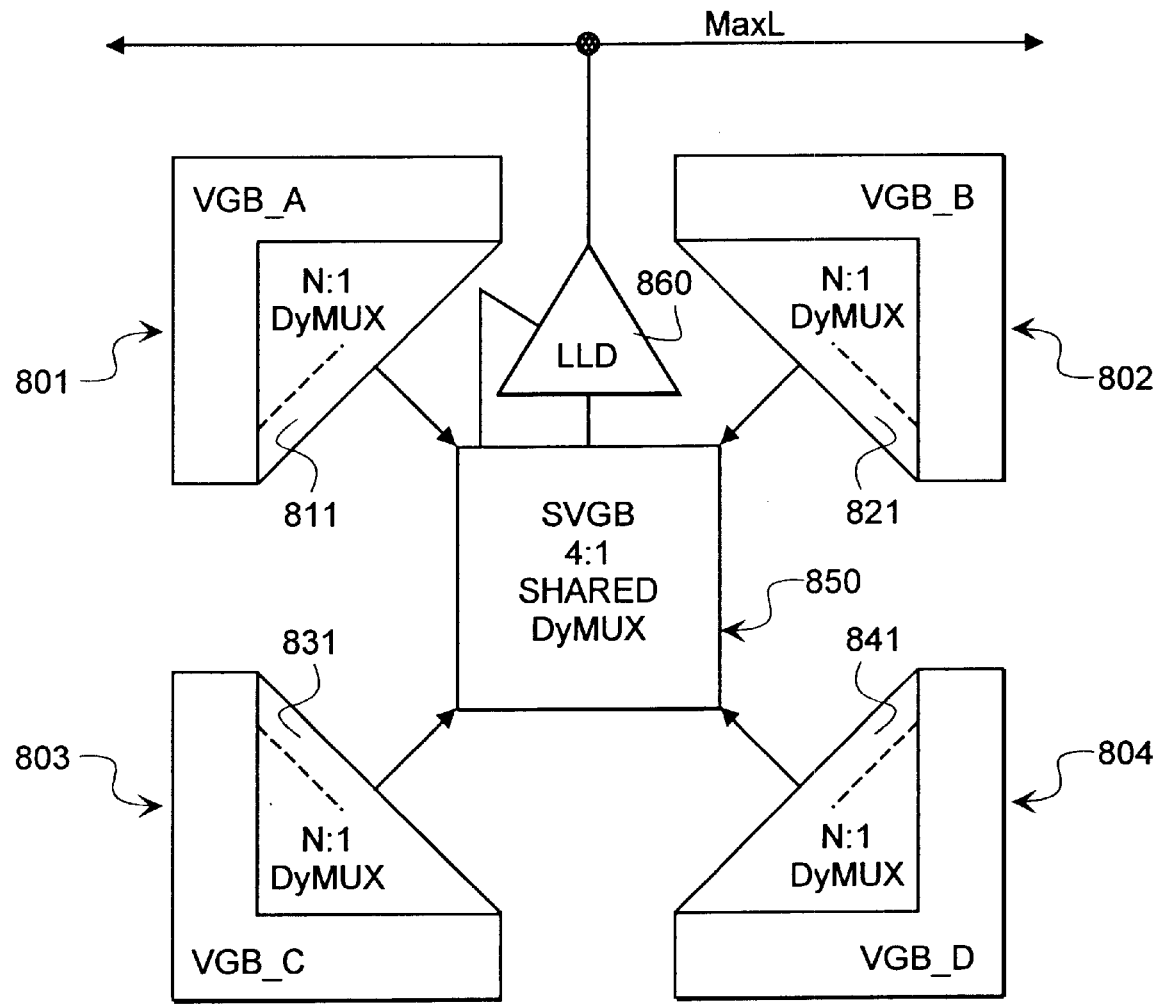
FIG 8 is a schematic showing how plural ones of VGB's can be combined to provide higher levels of dynamic multiplexing therefore; and which text is derived from page 38, lines 10–17 of co-pending and cross referenced U.S. application Ser. No. 09/626,094.

FIG. 8 illustrates yet a further carrying out of techniques in accordance with the invention. A pre-configured super-VGB (SVGB) is shown at 800. SVGB 800 includes four VGB's 801, 802, 803 and 804, wherein at least two of these VGB's 801–804 are pre-configured to synthesize an N:1 DyMUX in accordance with at least one of the above-described techniques. For each of VGB's 801–804, the respective value of N can be any integer in the range 2 to 13. Typically, the respective value of N will be the same for each of VGB's 801–804.

Dashed areas 811, 821, 831 and 841 represent post-{dynamic multiplexing} functions if any that may be optionally carried out in respective VGB's 801, 802, 803 and 804 if remaining resources are left over for such post-functions after the N:1 DyMUX of each VGB is implemented.

Area 850 is a shared processing region of the SVGB 800. Area 850 can be programmably-configured to implement either a 2:1 DyMUX or a 4:1 DyMUX. Details concerning such implementation within the shared region of each SVGB may be found in at least one of the above-cited patent applications.

One of the longline drivers (LLD) of the SVGB is shown at 860 as having its data input driven by the 4:1 DyMUX (or 2:1 DyMUX) implemented in shared area 850. The DyOE terminal of LLD 860 is also appropriately driven from the shared area 850. The output of LLD 860 connects to an adjacent MaxL line.

When each of VGB's 801, 802, 803 and 804, implements an N:1 DyMUX and the shared region 850 implements a further 4:1 DyMUX, the SVGB 800 can provide the functionality of a {4×N}:1 DyMUX outputting to the MaxL line through LLD 860. Thus, each SVGB can efficiently provide a dynamic multiplexing capability of as much as 52:1 if desired. Further time-domain multiplexing onto the MaxL line can be provided by appropriate control of the DyOE terminals of multiple, like SVGB's that drive the same MaxL line. Thus, four SVGB's each configured as shown in FIG. 8 and all driving the same MaxL line can provide an effective multiplexing of 208 different signals onto that one MaxL line.

Figure 9A:
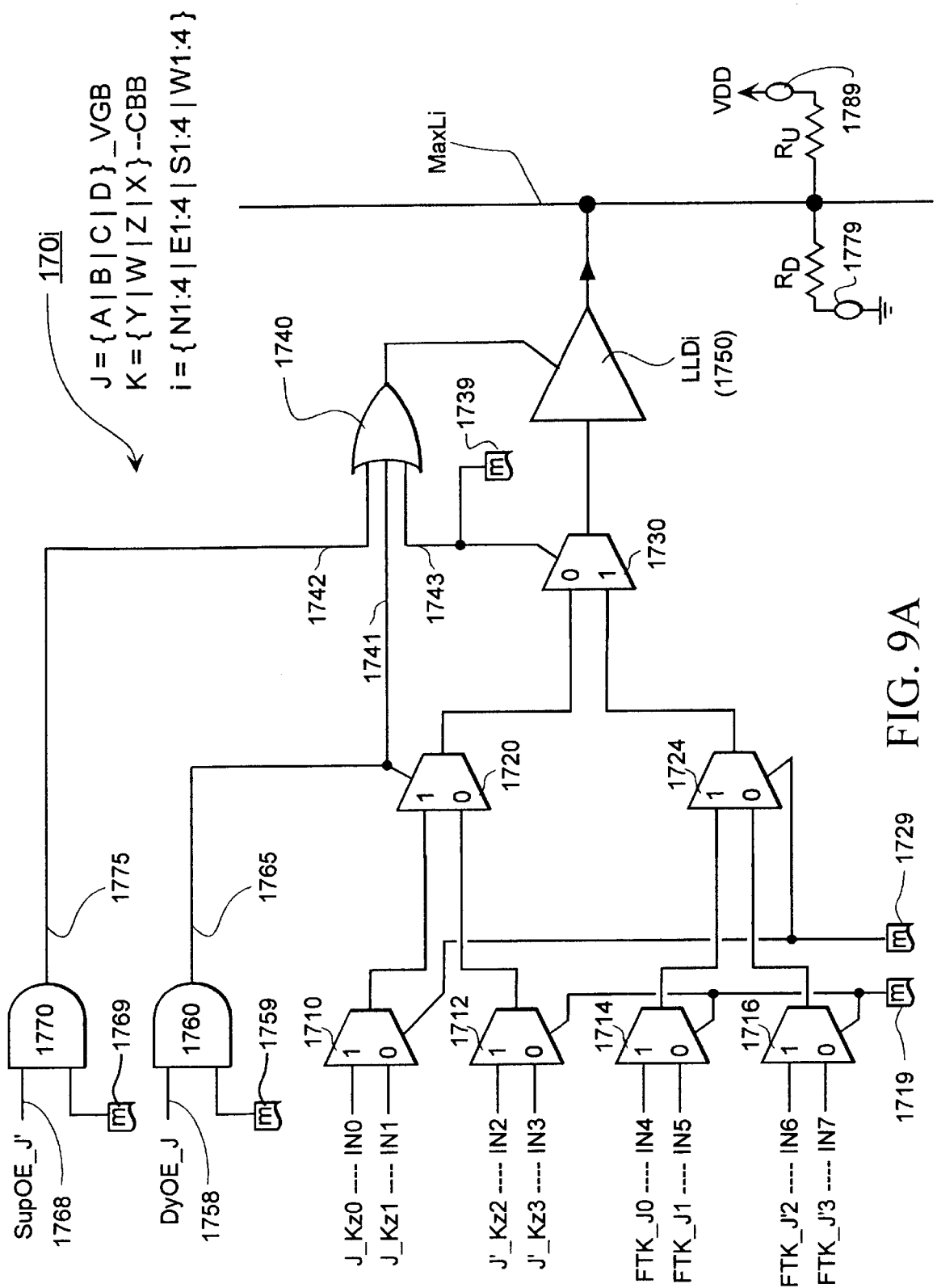
FIG. 9A is a schematic of shared, big drive logic useable for each MaxL line driver of a given super-VGB.

FIG. 9A is a schematic diagram of shared big drive, logic circuit 1701 where i equals 1 through M for the respective plurality of M MaxL line drivers in the shared core 150 (FIG. 1A) of each super-VGB. In one embodiment, M=16. These 16 drivers are uniformly distributed as: (a) 4 northern MaxL line drivers for driving a respective 4 northern MaxL lines adjacent to the super-VGB; (b) 4 eastern MaxL line drivers for a respective 4 eastern, adjacent MaxL lines; (c) 4 southern MaxL line drivers for a respective 4 southern, adjacent MaxL lines; and (d) 4 western MaxL line drivers for a respective 4 western, adjacent MaxL lines. (See 391–394 of FIG. 3.)

In FIG. 9A, J or J' represent one of the _A, _B, _C and _D VGB's of a given super-VGB. K designates one of the X, Z, W, and Y CBB's. FTK designates a feedthrough signal from a respective CBB. FIG. 9B provides a matrix showing a mix used in one embodiment. Other mixes are of course also possible. The respective inputs of multiplexers 1710–1716 are named as IN0 through IN7, or alternatively as J_Kz0 through J'_Kz3 and as FTK_J0 through FTK_J'3 as shown.

It is understood that multiplexers 1710 and 1714 form the shared logic section (380) within first VGB J while multiplexers 1712 and 1716 form the shared logic section (380') within second VGB J'. Multiplexers 1720 and 1724 are arranged outside of first and second VGB's J and J' since these multiplexers 1720,1724 collect signals from both of VGB's J and J'.

Multiplexer 1720 may be used to dynamically select between the configuration-defined output of either multiplexer 1710 or multiplexer 1720. Configuration memory bit 1719 drives the selection control terminal of multiplexer 1712 as well as those of multiplexers 1714 and 1716. Configuration memory bit 1729 drives the selection control terminal of multiplexer 1710 as well as that of multiplexer 1724. The selection control terminal of multiplexer 1720 is driven by AND gate 1760. One input of AND gate 1760 is driven by configuration memory bit 1759. Another input of AND gate 1760 is driven by the DyOE_J signal on line 1758. This DyOE_J signal is a common-controls derived signal such as 358 of FIG. 3. Given that multiplexer 1710 obtains a CSE output signal from a first VGB, J and that multiplexer 1720 obtains a CSE output signal from a second VGB, J', when configuration memory bit 1759 is at log1c 1, the DyOE_J signal (1758) passes through onto line 1765 and as such may be used to dynamically select an output from one of VGB's J and J' as an input for longline driver LLDi (1750). When 1765 is high (logic 1), the output of 1710 is selected. When 1765 is low (logic 0), the output of 1720 is selected. This is indicated by the placement of the '1' and '0' symbols at the data inputs of multiplexer 1720. Such symbology is used throughout. As such, the basic operations of configuration memory bits 1719, 1729, 1739, 1759 and 1769 are understood from the schematic. As will be understood, configuration memory bit 1739 should be set low, while bit 1769 and line 1768 should be set high when it is desired to use line 1758 as a dynamic selection control.

When configuration memory bit 1739 is set high, the correspondingly-controlled multiplexer 1730 passes through one of the feedthrough signals (IN4 through IN7) selected by multiplexers 1714, 1716 and 1724. The high on bit 1739 also passes through input 1743 of OR gate 1740 to fixedly activate the output enable terminal of three-state longline driver 1750. Signals on lines 1741 and 1742 become don't-cares under this condition.

If bit 1739 is set low, a high on one of OR gate inputs 1741 and 1742 may alternatively pass through gate 1740 to activate the OE terminal of tri-state driver 1750. If all of configuration memory bits 1739, 1759 and 1769 are set low, the tri-state driver 1750 (LLDi) is disabled and placed in a high output impedance state. In one embodiment, the output stage of tri-state driver 1750 features PMOS output transistors with channel widths of approximately 35 microns and NMOS output transistors with channel widths of approximately 15 microns.

Input line 1768 of AND gate 1770 represents an alternate or supplemental output enable. Like line 1758, line 1768 connects to one of the DyOE signals developed within the common control sections of the super-VGB. If configuration memory bit 1769 is set high while each of 1759 and 1739 is low, the output of multiplexer 1712 passes through 1720 and 1730 to become the input of driver 1750. The SupOE_J' signal of line 1768 may act at the same time as a dynamic output enable mat activates and deactivates tri-state driver 1750.

If configuration memory bit 1759 is set high while each of 1769 and 1739 is low, output 1765 functions as both a dynamic output enable for tri-state driver 1750 and as a selector on multiplexer 1720. Obviously, the '0' input of 1720 is a don't-care in this situation because LLDi 1750 is disabled when 1765 goes low and by happenstance selects the '0' input of 1720.

In one embodiment, one or more of the MaxL lines may be configurably connectable to a weak pull-up resistor $R_U$ and/or to a weak pull-down resistor $R_D$ via respective PIP's 1779 and/or 1789 as shown. Those skilled in the art will appreciate that narrow-channel pass-transistors of appropriate P or N type may be used to integrally implement both the resistive portion and the PIP portion of these line urging means 1779 and/or 1789. When PIP 1789 is activated to resistively connect the MaxLi line to pull-up voltage $V_{DD}$, a wired-AND gale may be implemented on the MaxLi line if each line driver LLDi of that line has a zero at its input and the corresponding OE terminal of each such line driver LLDi receives an input signal of the wired-AND gate, for example, from line 1775. In the latter case, the SupOE_J' signal of line 1775 may be derived from a complex function signal that has been placed on an AIL of the super-VGB and has been acquired by one of the 14:1 control-acquiring multiplexers. (See FIG. 3.) As such, wired-ANDing of a plurality of complex function signals may be realized along the MaxLi line when desired.

Conversely, when PIP 1779 is activated to resistively connect the MaxLi line to ground (logic '0'), a wired-OR gate may be implemented on the MaxLi line if each line driver LLDi of that line has a logic one at its input and the corresponding OE terminal of each such line driver LLDi receives an input signal of the wired-OR gate, for example, from line 1775.

In an alternate embodiment, no pull-ups or pull-downs are provided on the MaxLi lines within the core of the FPGA. Instead, configuration-activatable, weak pull-up resistors ($R_U$) are provided only on a selected subset of longlines (4 lines in each VIC or HIC) within the peripheral interconnect channels. These peripheral NOR lines may be driven by adjacent IOB's and/or by the longline drivers of immediately adjacent super-VGB's to implement wide-input NOR functions.

Referring to the configurations matrix of FIG. 9B, note that the northern MaxL drivers N1:4 acquire their DyOE_J and SupOE_J' signals respectively from the northern VGB's _A and _B. Similarly, the eastern drivers E1:4 acquire their DyOE signals from eastern VGB's _B and D; the southern drivers S1:4 acquire their DyOE signals from southern VGB's _D and _C; and the western drivers W1:4 acquire their DyOE signals from western VGB's _C and _A.

In similar vein, for the northern MaxL drivers N1:4, the IN0–IN3 signals are acquired respectively from the northern VGB's B and A. For drivers N1 and N3, dynamic selection is possible between the Y and X CBB's of VGB's _B and _A. For drivers N2 and N4, dynamic selection is possible between the Z and W CBB's. A corresponding pattern is shown for the other drivers, E1:4, Sl:4 and Wl:4.

Additionally, for the northern MaxL drivers N1:4, the IN4–IN7 feedthrough signals are acquired respectively from the FTX1 and FTX2 lines of northern VGB's _B and _A. A corresponding pattern is shown for the other drivers, E1:4, S1:4 and W1:4.

Note that same source signals are seen multiple times in the matrix of FIG. 9B. For example, the A_Yz CSF output signal may be routed to any one or all of the following tri-state drivers: N1, N3, W1 and W4. The FTX1_A feedthrough signal may be routed to any one or all of the following tri-state drivers: N1, N2, N3 and N4. The below Table-1 and Table-2 show the respective routing options for the CSE outputs and the feedthroughs.

TABLE 1

| CSE Output Source | Dest1 | Dest2 | Dest3 | Dest4 |
|---|---|---|---|---|
| A_Xz | N1 | N4 | W1 | W3 |
| A_Yz | N1 | N3 | W1 | W4 |
| A_Wz | N2 | N4 | W2 | W3 |
| A_Zz | N2 | N3 | W2 | W4 |
| B_Xz | N1 | N4 | E1 | E3 |
| B_Yz | N1 | N3 | E1 | E4 |
| B_Wz | N2 | N4 | E2 | E3 |
| B_Zz | N2 | N3 | E2 | E4 |
| C_Xz | S1 | S4 | W1 | W3 |
| C_Yz | S1 | S3 | W1 | W4 |
| C_Wz | S2 | S4 | W2 | W3 |
| C_Zz | S2 | S3 | W2 | W4 |
| D_Xz | S1 | S4 | E1 | E3 |
| D_Yz | S1 | S3 | E1 | E4 |
| D_Wz | S2 | S4 | E2 | E3 |
| D_Zz | S2 | S3 | E2 | E4 |

Note from the above Table-1 that a nibble's-worth of data may be output from a given VGB through four, same-directed MaxL drivers to the adjacent MaxL lines. For example, CSE outputs: A_Xz, A_Yz, A_Wz, and A_Zz, may be simultaneously and respectively routed to: N1, N3, N4 and N2. Alternatively, CSE outputs: A_Xz, A_Yz, A_Wz, and A_Zz, may be simultaneously and respectively routed to: W3, W1, W2 and W4.

TABLE 2

| Feedthrough Source | Dest1 | Dest2 | Dest3 | Dest4 |
|---|---|---|---|---|
| FTX1_A | N1 | N2 | N3 | N4 |
| FTX2_A | N1 | N2 | N3 | N4 |
| FTY1_A | W1 | W2 | W3 | W4 |
| FTY2_A | W1 | W2 | W3 | W4 |
| FTX1_B | N1 | N2 | N3 | N4 |
| FTX2_B | N1 | N2 | N3 | N4 |
| FTY1_B | E1 | E2 | E3 | E4 |
| FTY2_B | E1 | E2 | E3 | E4 |
| FTX1_C | S1 | S2 | S3 | S4 |
| FTX2_C | S1 | S2 | S3 | S4 |
| FTY1_C | W1 | W2 | W3 | W4 |
| FTY2_C | W1 | W2 | W3 | W4 |
| FTX1_D | S1 | S2 | S3 | S4 |
| FTX2_D | S1 | S2 | S3 | S4 |
| FTY1_D | E1 | E2 | E3 | E4 |
| FTY2_D | E1 | E2 | E3 | E4 |

Note from the above Table-2 that a nibble's-worth of data may be fedthrough from parallel legs of a given pair of adjacent VGB's through four, same-directed MaxL drivers to the adjacent MaxL lines. For example, feedthrough outputs: FTX1_A, FTX2_A, FTX1_B and FTX2_B, may be simultaneously and respectively routed to: N1, N2, N3 and N4. Alternatively, feedthrough outputs: FTY1_A, FTY2_A, FTY1_C and FTY2_C may be simultaneously and respectively routed to: W1, W2, W3 and W4.

Figure 9C:
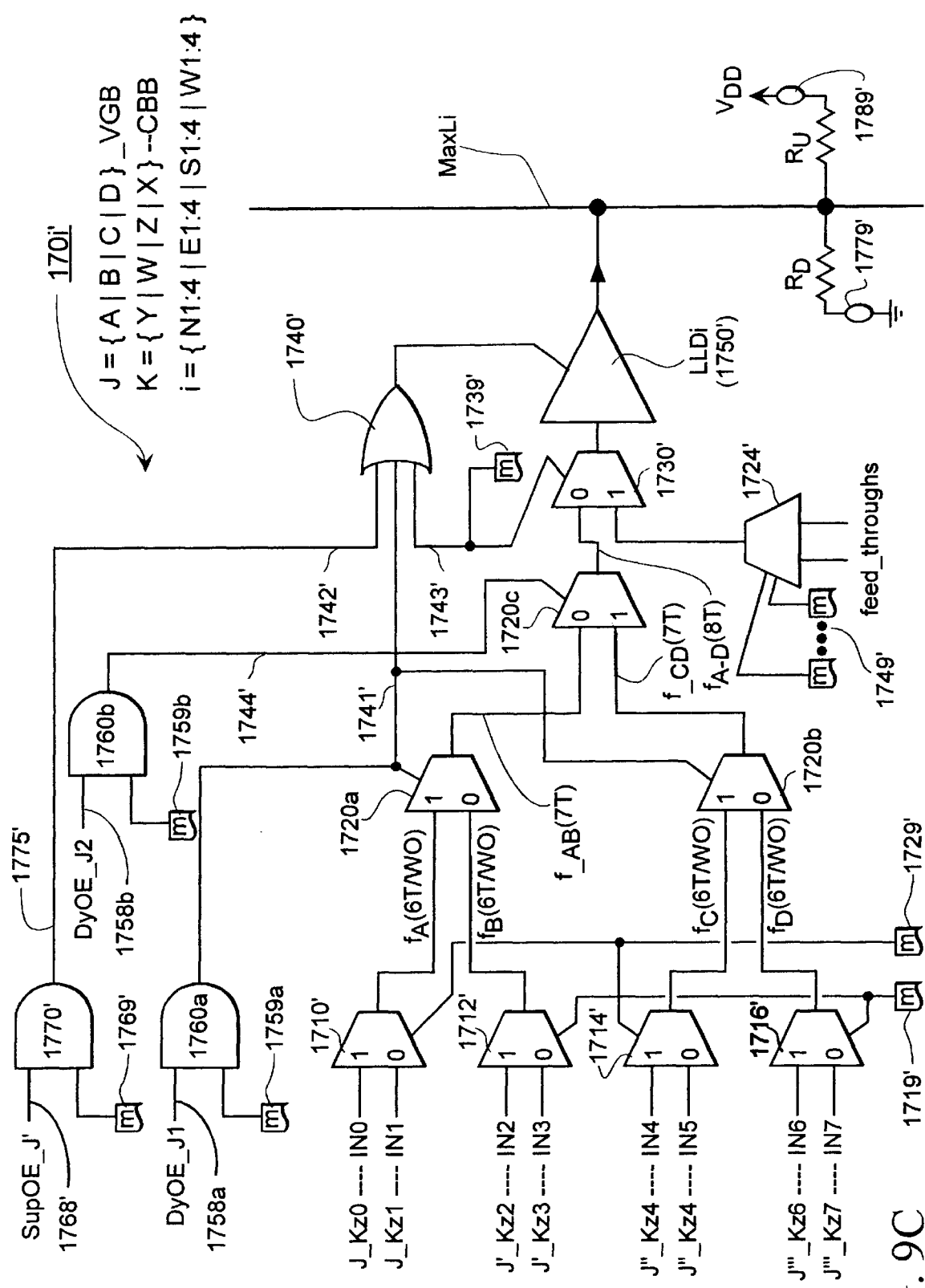
FIG. 9C is a schematic of an alternate shared, big drive logic for folding together the resources of 4 VGB's.

FIG. 9C is a schematic diagram of an alternate design for each shared big drive, logic circuit 170i' where i' equals 1 through M for the respective plurality of M MaxL line drivers in the shared core 150 (FIG. 1A) of each super-VGB. Like reference numerals in the '1700' number series are used in FIG. 9C for elements having like counterparts in FIG. 9A. As such, the functions of most of the like-numbered elements will be understood by implication.

A major difference in the alternate logic circuit 170i' of FIG. 9C is that dynamic selection is carried one level deeper to produce signal $f_{A-D}(8T)$ at the output of multiplexer 1720c, where signal $f_{A-D}(8T)$ can be any function of as many as 8 independent input terms. In essence, the function synthesis capabilities of all four VGB's (_A through _D) of the encompassing super-VGB are being folded together in the alternate shared logic circuit 170i'.

To produce the $f_{A-D}(8T)$ signal, each of multiplexers 1710', 1712', 1714' and 1716' receives Kz signals from respective ones of VGB's _A through _D. Multiplexer 1710' produces a first 6-term (or wide-output) signal, $f_A(6T/WO)$ which was synthesized in VGB_A. Multiplexer 1712' produces a second 6-term (or wide-output) signal, $f_B(6T/WO)$ which was synthesized in VGB_B. Multiplexer 1714' produces a third 6-term (or wide-output) signal, $f_C(6T/WO)$ which was synthesized in VGB_C. Multiplexer 1716' produces a fourth 6-term (or wide-output) signal, $f_D(6T/WO)$ which was synthesized in VGB_D.

Multiplexer 1720a dynamically selects between $f_A(6T/WO)$ and $f_B(6T/WO)$ in response to selection control signal 1741' which is developed from DyOE_J1 by AND gate 1760a. In similar fashion, multiplexer 1720b dynamically selects between $f_C(6T/WO)$ and $f_D(6T/WO)$ in response to selection control signal 1741' (or in yet a further alternative embodiment, in response to a different selection control signal which is derived from another DyOE signal). The outputs of multiplexers 1720a and 1720b are therefore respectively denoted as $f_{-AB}(7T)$ and $f_{-CD}(7T)$ to indicate they can be any function of up to 7 independent input terms.

Multiplexer 1720c dynamically selects between $f_{-AB}(7T)$ and $f_{-CD}(7T)$ in response to selection control signal 1744' which is developed from DyOE_J2 by AND gate 1760b. DyOE_J1 can be produced by the common controls section of one VGB while DyOE_J2 can be simultaneously produced by the common controls section of a second VGB and SupOE_J' (1768') is simultaneously produced by the common controls section of a third VGB of the same super-VGB. The choice of which VGB produces which of signals DyOE_J1, DyOE_J2 and SupOE_J' can vary.

As is further seen in FIG. 9C, multiplexer 1730' statically selects either the $f_{A-D}(8T)$ output signal of multiplexer 1720c or a feedthrough signal that is stat by, and provided by, multiplexer 1724'. The output of multiplexer 1730' is coupled to the input of tristate driver 1750'. Although not shown, it is understood that multiplexer 1724' is coupled to receive respective feedthrough signals (FTX and/or FTY) from each of VGB's _A through D and to statically select one of those feedthrough signals in accordance with configuration data stored in the FPGA device's configuration memory at 1749'.

Figure 10:
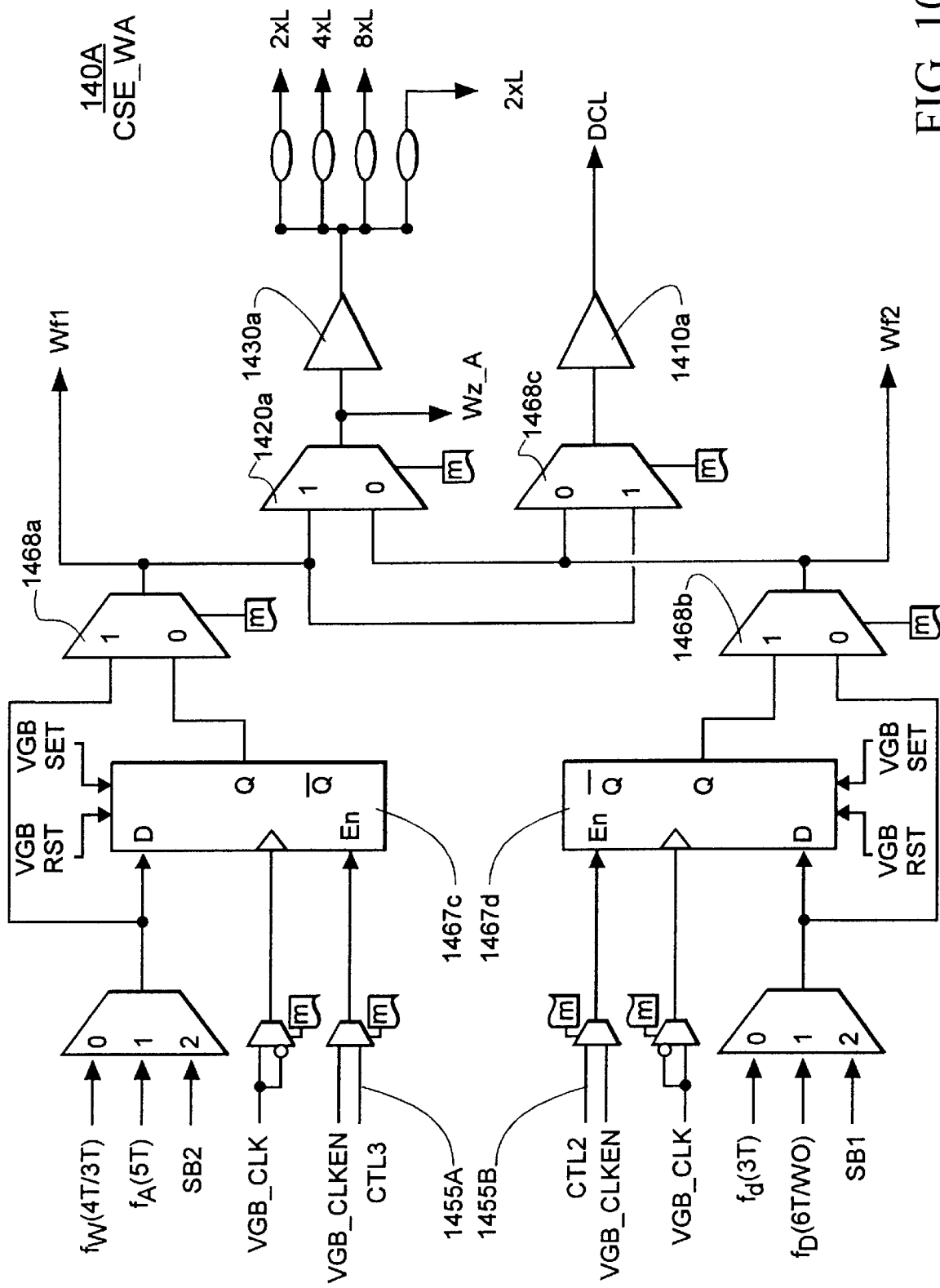
FIG. 10 is a schematic of an alternative Configurable Sequential Element (CSE).

FIG. 10 shows an alternative (larger) design for a W CSE. This alternative design 140A is understood to be generically applicable to the Y, Z and X CSE's also. Note that here, the outputs of each of LUT's c and d gets access to a respective data-storing flip flop (1467c and 1467d) so that either signal may be output synchronously with the VGB_CLK as well as asynchronously. Both of the CTL2 and CTL3 control signals are available for respective individual control of clock enables to respective flip flops 1467c and 1467d. Nibble significance can run both forward and backwards as indicated by availability of both SB2 and SB1 in this alternative design for the W CSE. Although not shown, it is understood that the alternate Y CSE would get both SB0 and SB3, as would The alternate X CSE. The alternate Z CSE would get both SB1 and SB2. Note that both the f(6T/WO) and the f(5T) function synthesis results are available for output through the one CSE 140A synchronously or asynchronously. Moreover, register-bypass multiplexers 1468a and 1468b allow output to respective feedback lines Wf1 and Wf2 of either the synchronous output (Q) of respective flip flops 1467c and 1467d or the asynchronous input (D). DC-selecting multiplexer 1468c can be configured to select the output of either of multiplexers 1468a and 1468b for application to DC line driver 1410a. 2/4/8/M×L-selecting multiplexer 1420a can be configured to select the output of either of multiplexers 1468a and 1468b for application to 2/4/8×L lines driver 1430a to the shared logic as signal Wz_A. Of course, the alternate CSE design 140A of FIG. 14E consumes more circuit space than does the design 60Y of FIG. 6. The latter, smaller design is preferable where circuit space is tight and it is desirable to keep power consumption small. Further modifications to CSE design 140A can be made so as to give each CBE its own private DC line driver and/or its own private 2/4/8xL lines driver. But such further modifications would disadvantageously increase circuit space utilization and power consumption.

Given the above disclosure of general concepts and specific embodiments, the scope of protection sought is to be defined by the claims appended hereto.

What is claimed is:

1. A programmed field programmable gate array (FPGA) wherein said FPGA, in an unprogrammed state thereof is characterized as having a plurality of variably granulatable building elements provided in respective building block regions of the FPGA such that the building elements can be folded-together during configuration of the unprogrammed FPGA to thereby define differently-sized logic-implementing units and wherein said unprogrammed FPGA further has Configurable Sequential Elements (CSE's) associated with the building blocks for storing and outputting respective result signals to adjacent interconnect lines, wherein each CSE includes a plurality of registers where at least two of the registers of a given CSE can be each configurably coupled to receive and store a respective logic result signal produced by one or a folded-together combination of said building elements, and wherein a building block of said programmed FPGA comprises:

(a) input acquiring means for selectively acquiring an input signal from adjacent interconnect lines;
    (b) a configured first forwarding means for forwarding the acquired input signal to a corresponding CSE;
    (c) a return mechanism for returning the forwarded input signal to at least one building element of the building block for processing by the at least one building element; and
    (d) a configured second forwarding means for forwarding the processed signal to the corresponding CSE for output by the corresponding CSE to an adjacent interconnect line.

2. The programmed FPGA of claim 1 wherein:

(b.1) the a configured first forwarding means includes a dynamic multiplexer for dynamically selecting the acquired input signal that is sent to the corresponding CSE.

3. The programmed FPGA of claim 2 wherein:

(b.2) a plurality of building blocks of said programmed FPGA are configured to respectively and dynamically select respective ones of acquired input signals from dynamically selectable buses for forwarding to corresponding CSEs.

4. A field programmable gate array (FPGA) having a plurality of variably granulatable building elements provided in respective variable grain blocks (VGB's) of the FPGA such that the building elements can be folded-together during configuration of the FPGA to thereby define differently-sized logic-implementing units and wherein said FPGA further has output means for outputting respective result signals of VGB's to adjacent interconnect lines, wherein:

(a) at least two of said VGB's can be each configured to implement at least an N-to-one (N:1) dynamic multiplexer, where N is an integer of value 4 or greater; and
    (b) the FPGA further has for at least said two of the VGB's, a shared dynamic multiplexer that can be configured to dynamically select between outputs of the N:1 dynamic multiplexers of said at least two VGB's, thereby providing a dynamic multiplexing capability of at least two-times N.

5. The FPGA of claim 4 wherein N is at least eight.

6. The FPGA of claim 4 wherein:

(b.1) the shared dynamic multiplexer can be configured to dynamically select between outputs of the N:1 dynamic multiplexers of at least four VGB's, thereby providing a dynamic multiplexing capability of at least four-times N.

7. A field programmable gate array (FPGA) comprising:

(a) a plurality of variably granulatable building elements provided in respective variable grain blocks (VGB's) of the FPGA such that the building elements can be folded-together during configuration of the FPGA to thereby define in each of the VGB's, programmably-sized dynamic multiplexing units each having a respective number of dynamically multiplexable inputs corresponding to the programmably-defined size of the respective dynamic multiplexing unit; and
    (b) at least one, shared dynamic mulitiplexer that is shareable by plural ones of the VGB's at least for implementing by combination with the programmably-sized dynamic multiplexing units of the sharing VGB's, an N:1 dynamic multiplexer having a number of dynamically multiplexable inputs greater than the number of dynamically multiplexable inputs supportable by each of the programmably-sized dynamic multiplexing units which can be implemented in the plural VGB's that share said shared dynamic mulitiplexer.

8. The FPGA of claim 7 wherein the number of dynamically multiplexable inputs of said N:1 dynamic multiplexer is at least twice that of the dynamically multiplexable inputs supportable by each of the programmably-sized dynamic multiplexing units which can be implemented in the plural VGB's that share said shared dynamic mulitiplexer.

9. The FPGA of claim 8 wherein each of the programmably-sized dynamic multiplexing units in the respective VGB's can implement at least a 8:1 dynamic multiplexer so that said N:1 dynamic multiplexer can thereby provide at least a 16:1 dynamic multiplexing function.

10. The FPGA of claim 8 wherein each of the programmably-sized dynamic multiplexing units in the respective VGB's can implement at least a 13:1 dynamic multiplexer so that said N:1 dynamic multiplexer can thereby provide at least a 26:1 dynamic multiplexing function.

11. The FPGA of claim 10 wherein the number of dynamically multiplexable inputs of said N:1 dynamic multiplexer is at least four times that of the dynamically multiplexable inputs supportable by each of the programmably-sized dynamic multiplexing units which can be implemented in the plural VGB's that share said shared dynamic mulitiplexer, so that said N:1 dynamic multiplexer can thereby provide at least a 52:1 dynamic multiplexing function.

12. The FPGA of claim 7 wherein the number of dynamically multiplexable inputs of said N:1 dynamic multiplexer is at least four times that of the dynamically multiplexable inputs supportable by each of the programmably-sized dynamic multiplexing units which can be implemented in the plural VGB's that share said shared dynamic mulitiplexer.

13. A method of using a field programmable gate array (FPGA) to implement a dynamic multiplexing function, (0.1) where the FPGA has a plurality of variably granulatable building elements provided in respective variable grain blocks (VGB's) of the FPGA such that the building elements can be folded-together during configuration of the FPGA to thereby define in each of the VGB's, programmably-sized dynamic multiplexing units each having a respective number of dynamically multiplexable inputs corresponding to the programmably-defined size of the respective dynamic multiplexing unit; and (0.2) where the FPGA further has at least one, shared dynamic mulitiplexer that is shareable by plural ones of the VGB's at least for implementing by combination with the programmably-sized dynamic multiplexing units of the sharing VGB's, an N:1 dynamic multiplexer having a number of dynamically multiplexable inputs greater than the number of dynamically multiplexable inputs supportable by each of the programmably-sized dynamic multiplexing units which can be implemented in the plural VGB's that share said shared dynamic mulitiplexer;

said method comprising:

(a) configuring at least two VGB's to implement respective and same sized dynamic multiplexing units; and (b) configuring a shared dynamic mulitiplexer of the at least two VGB's to implement said N:1 dynamic multiplexer.

* * * * *